United States Patent
Pfeuffer

(10) Patent No.: US 9,761,772 B2
(45) Date of Patent: Sep. 12, 2017

(54) METHOD FOR PRODUCING AN OPTOELECTRONIC SEMICONDUCTOR CHIP WITH REFLECTIVE ELECTRODE

(71) Applicant: OSRAM Opto Semiconductors GmbH, Regensburg (DE)

(72) Inventor: Alexander Pfeuffer, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/423,066

(22) PCT Filed: Aug. 22, 2013

(86) PCT No.: PCT/EP2013/067445
§ 371 (c)(1),
(2) Date: Feb. 20, 2015

(87) PCT Pub. No.: WO2014/033041
PCT Pub. Date: Mar. 6, 2014

(65) Prior Publication Data
US 2015/0255692 A1    Sep. 10, 2015

(30) Foreign Application Priority Data
Aug. 28, 2012  (DE) .................. 10 2012 107 921

(51) Int. Cl.
*H01L 33/60* (2010.01)
*H01L 33/40* (2010.01)
(Continued)

(52) U.S. Cl.
CPC ............ *H01L 33/60* (2013.01); *H01L 33/005* (2013.01); *H01L 33/405* (2013.01); *H01L 33/44* (2013.01);
(Continued)

(58) Field of Classification Search
CPC ......... H01L 33/60; H01L 33/54; H01L 33/62; H01L 33/005; H01L 33/44; H01L 33/405;
(Continued)

(56) References Cited

U.S. PATENT DOCUMENTS 6,278,136 B1    8/2001  Nitta
2008/0240659 A1*  10/2008  Kopp .................. G02B 6/30
385/88

(Continued)

FOREIGN PATENT DOCUMENTS

DE    102010024079 A1    12/2011
DE    102010025320 A1    12/2011
(Continued)

*Primary Examiner* — Julio J Maldonado
*Assistant Examiner* — Stanetta Isaac
(74) *Attorney, Agent, or Firm* — Slater Matsil, LLP

(57) ABSTRACT

A method for producing an optoelectronic semiconductor chip is disclosed. In some embodiment the method includes arranging a metallic mirror layer on a top side of a semiconductor layer sequence, arranging a mirror protection layer at least on exposed lateral surfaces of the mirror layer in a self-aligning manner, wherein the mirror layer has openings toward the semiconductor layer sequence, and wherein the openings are framed in lateral directions by the mirror protection layer and partially removing the semiconductor layer sequence in a region of the openings of the mirror layer.

15 Claims, 22 Drawing Sheets

(51) Int. Cl.
*H01L 33/44* (2010.01)
*H01L 33/00* (2010.01)
*H01L 33/54* (2010.01)
*H01L 33/62* (2010.01)
*H01L 33/38* (2010.01)

(52) U.S. Cl.
CPC .............. *H01L 33/54* (2013.01); *H01L 33/62* (2013.01); *H01L 33/382* (2013.01); *H01L 2933/005* (2013.01); *H01L 2933/0016* (2013.01); *H01L 2933/0025* (2013.01); *H01L 2933/0033* (2013.01); *H01L 2933/0058* (2013.01); *H01L 2933/0066* (2013.01)

(58) Field of Classification Search
CPC ....... H01L 2933/0058; H01L 2933/005; H01L 2933/0066; H01L 2933/0033; H01L 2933/0025; H01L 33/382; H01L 2933/0016
See application file for complete search history.

(56) References Cited

U.S. PATENT DOCUMENTS

| | | |
|---|---|---|
| 2009/0283787 A1 | 11/2009 | Donofrio et al. |
| 2010/0171135 A1 | 7/2010 | Engl et al. |
| 2011/0068359 A1 | 3/2011 | Yahata et al. |
| 2011/0186953 A1* | 8/2011 | Plo l ................... H01L 33/0079 257/432 |
| 2012/0007121 A1 | 1/2012 | Lee et al. |
| 2012/0104413 A1* | 5/2012 | Bougrov ............ G01N 33/6803 257/76 |
| 2013/0140598 A1* | 6/2013 | Hoppel ................ H01L 33/382 257/98 |
| 2013/0187192 A1 | 7/2013 | Hoeppel |
| 2013/0228798 A1 | 9/2013 | Höppel |

FOREIGN PATENT DOCUMENTS

| | | |
|---|---|---|
| DE | 102010044986 A1 | 3/2012 |
| JP | 2003008055 A | 1/2003 |
| JP | 2005252086 A | 9/2005 |

\* cited by examiner

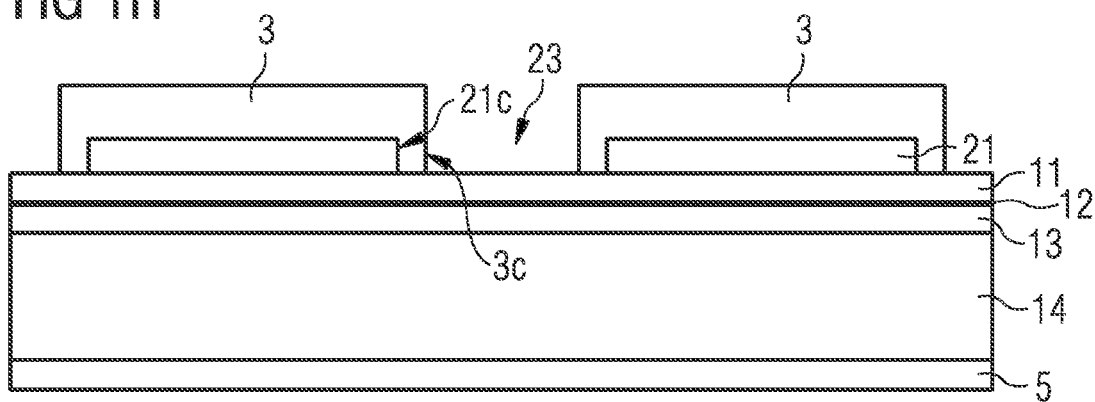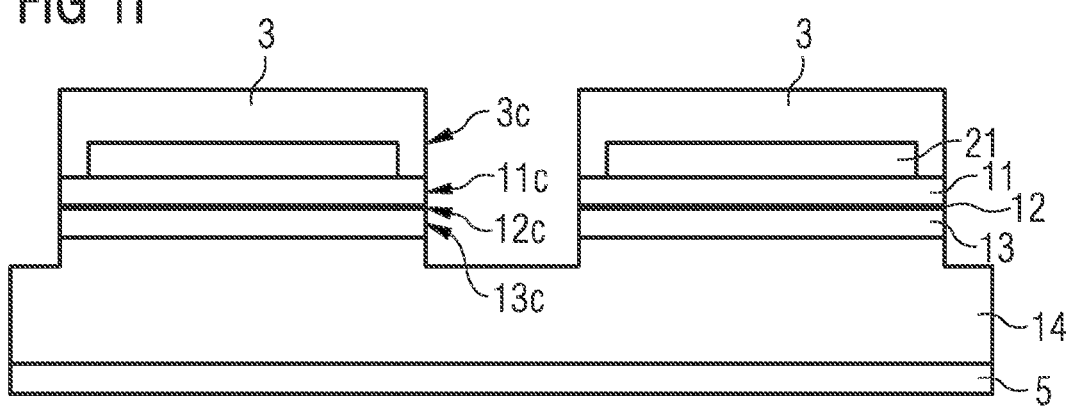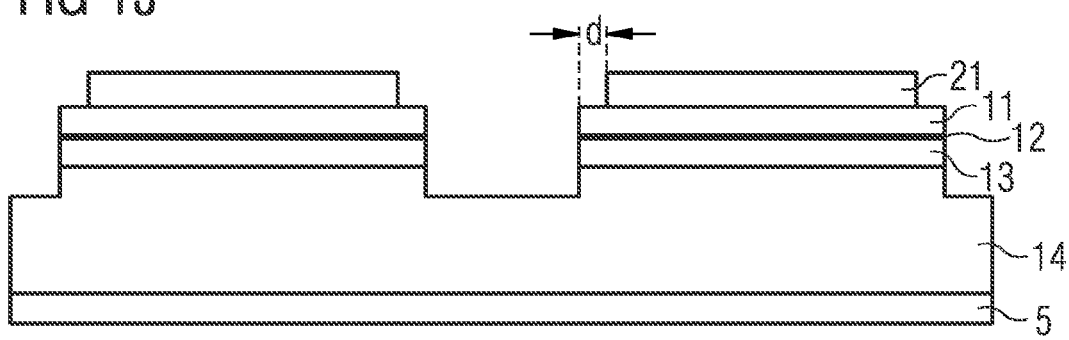

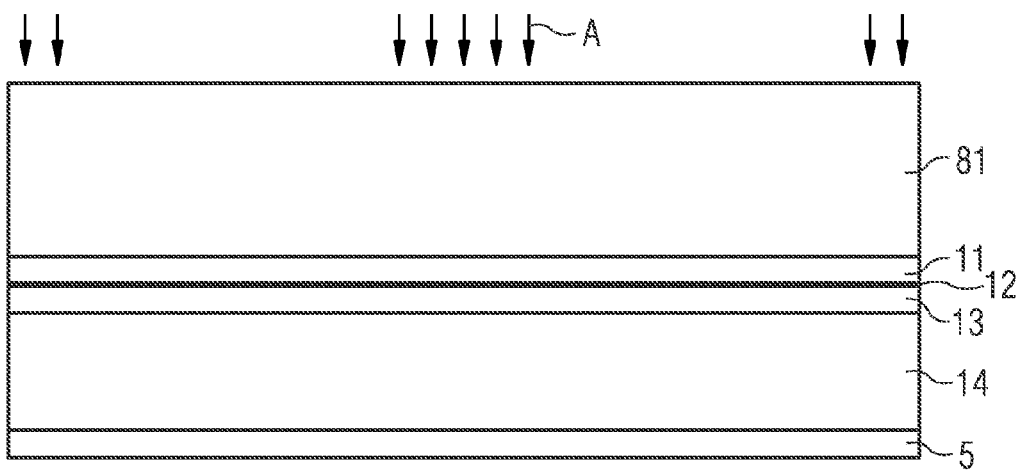
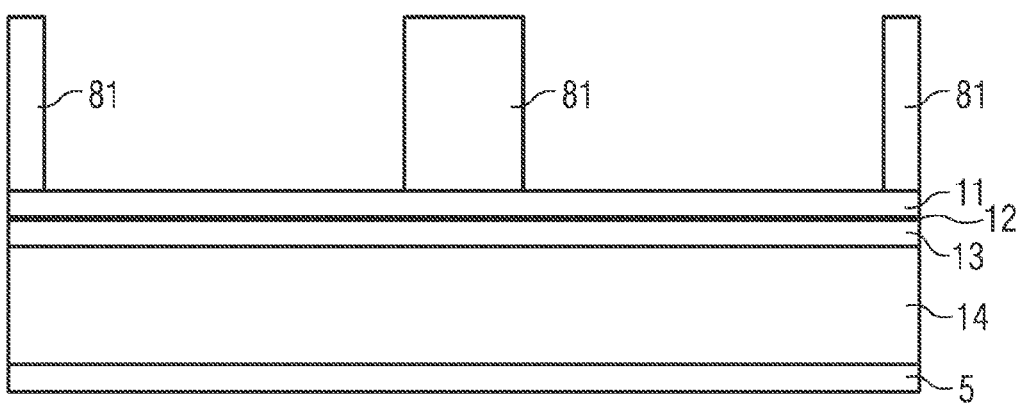
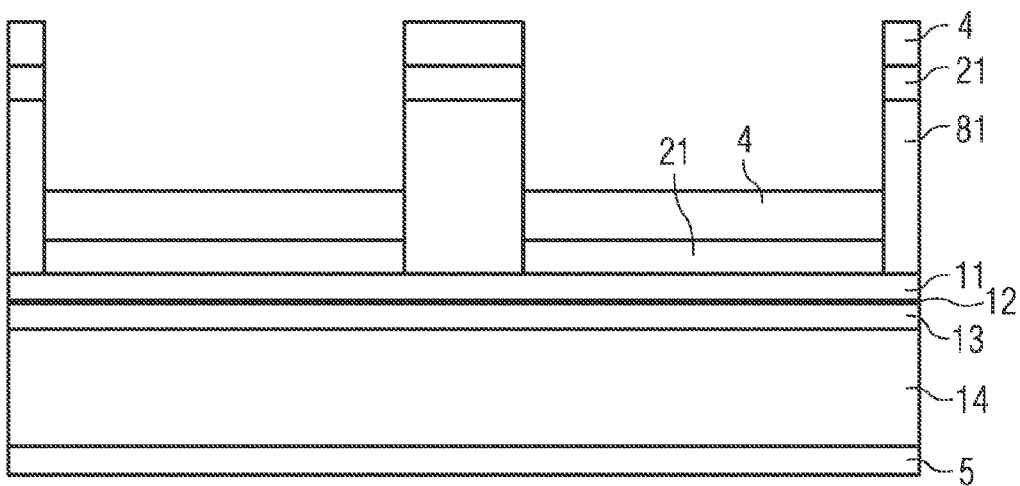

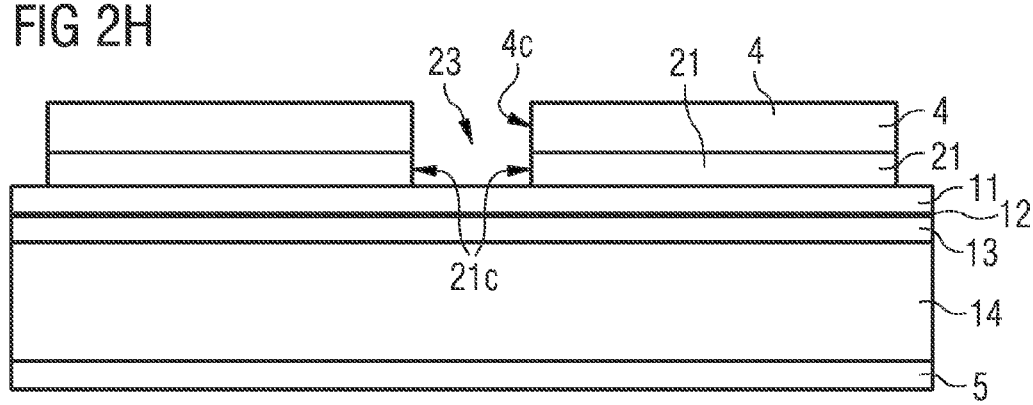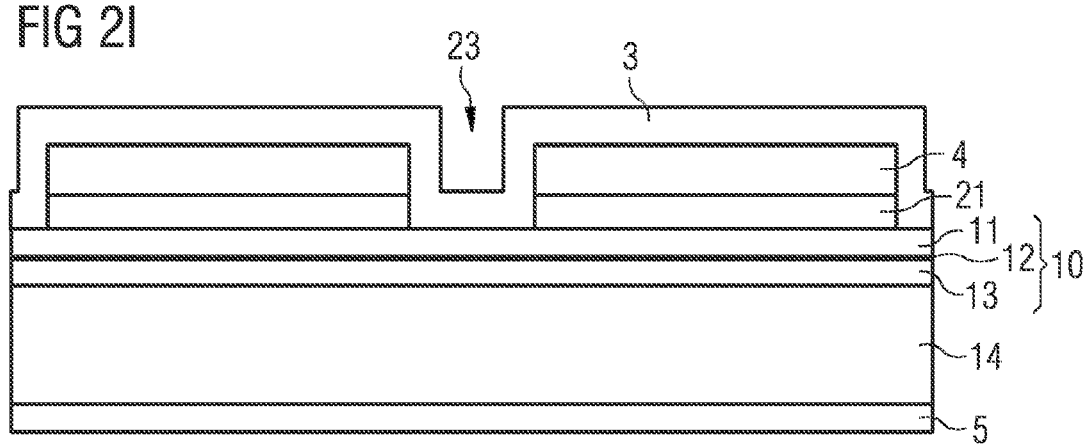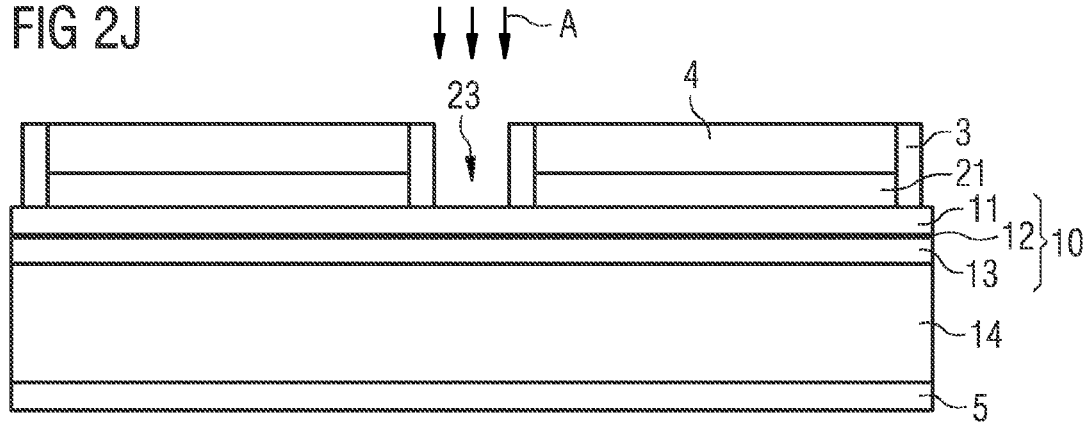

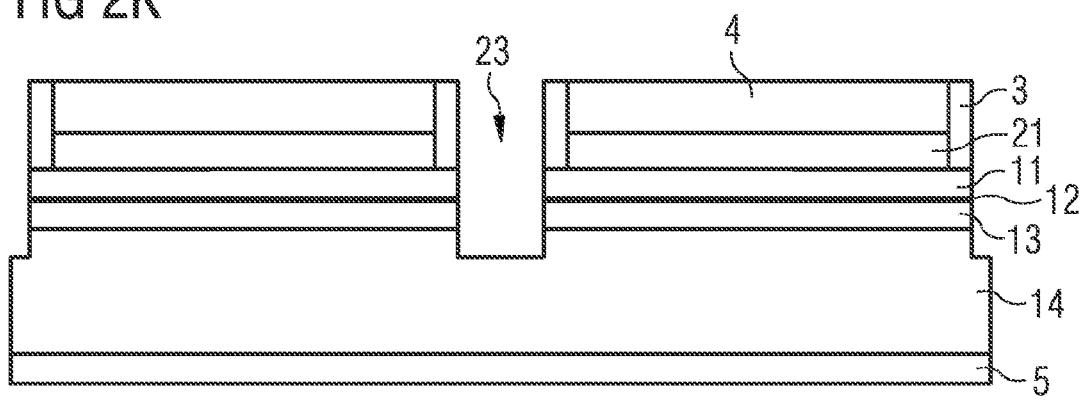
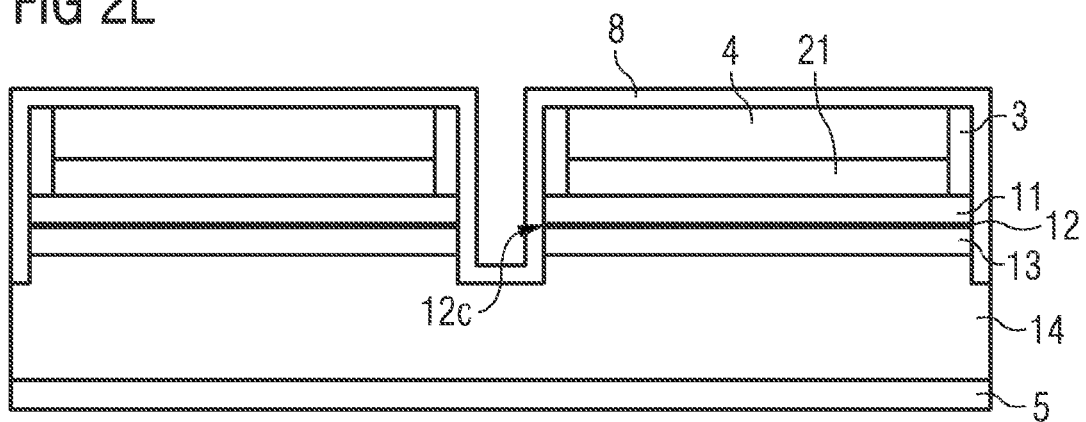
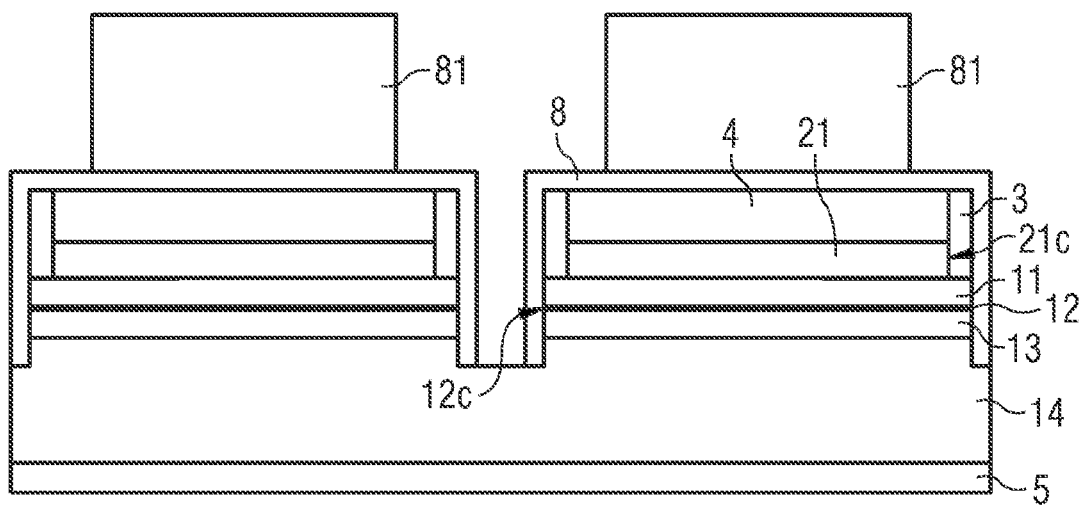

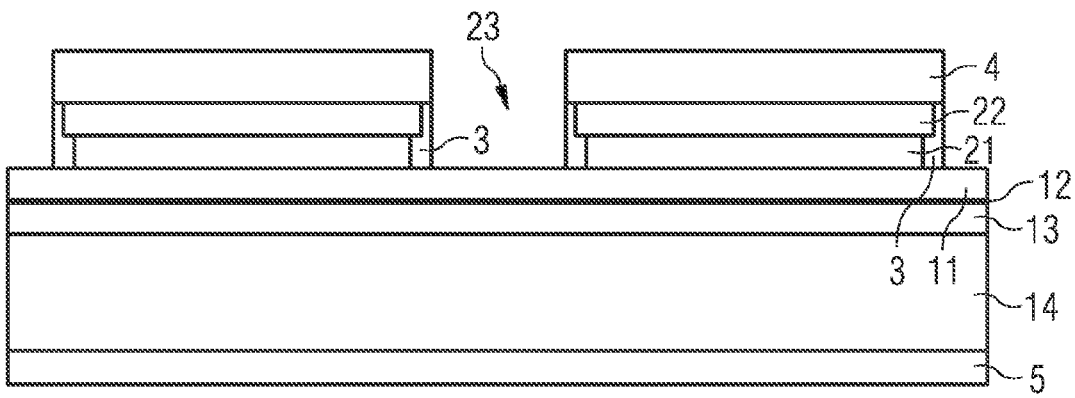
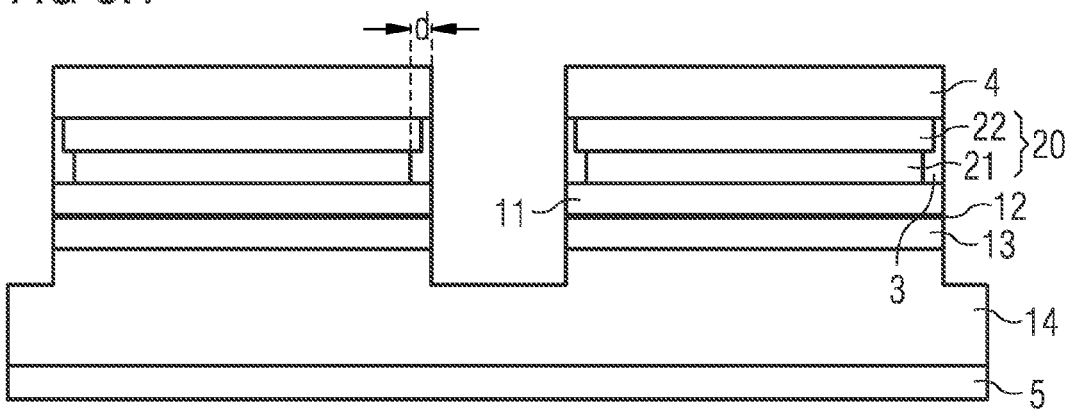
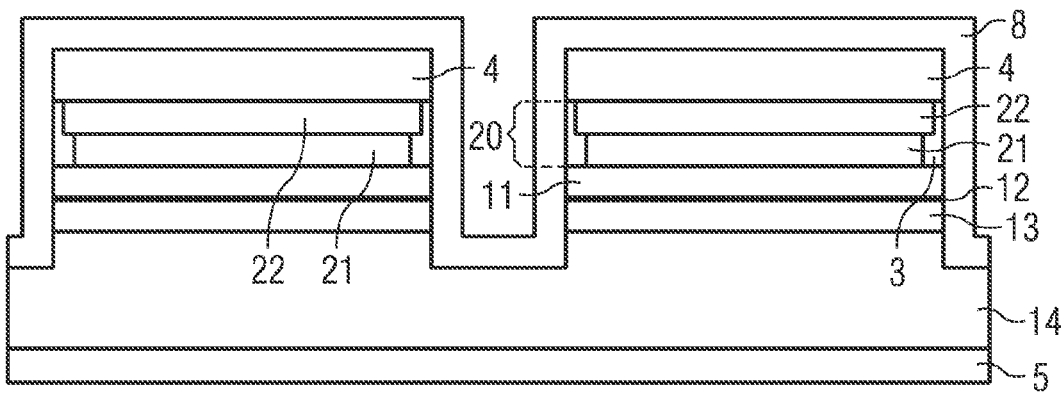

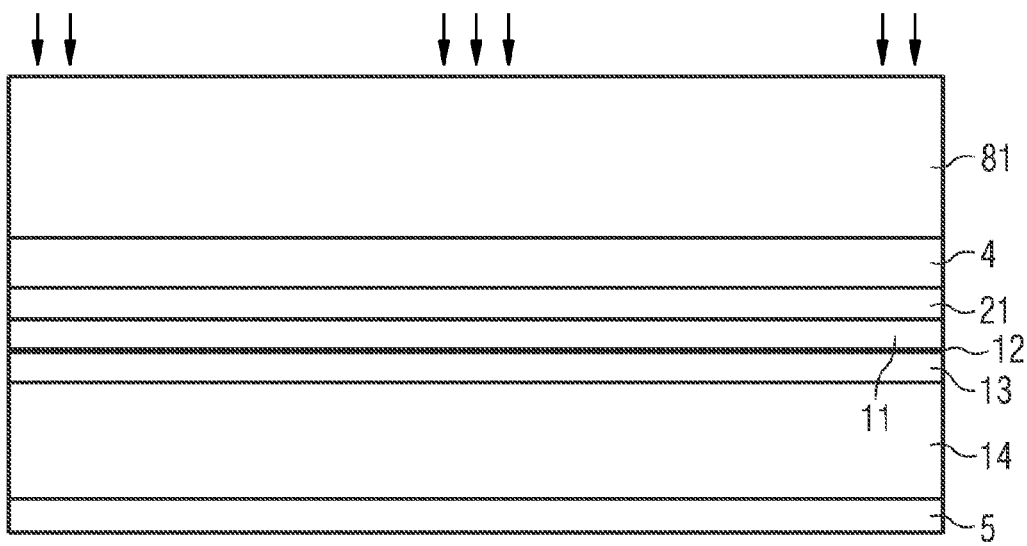
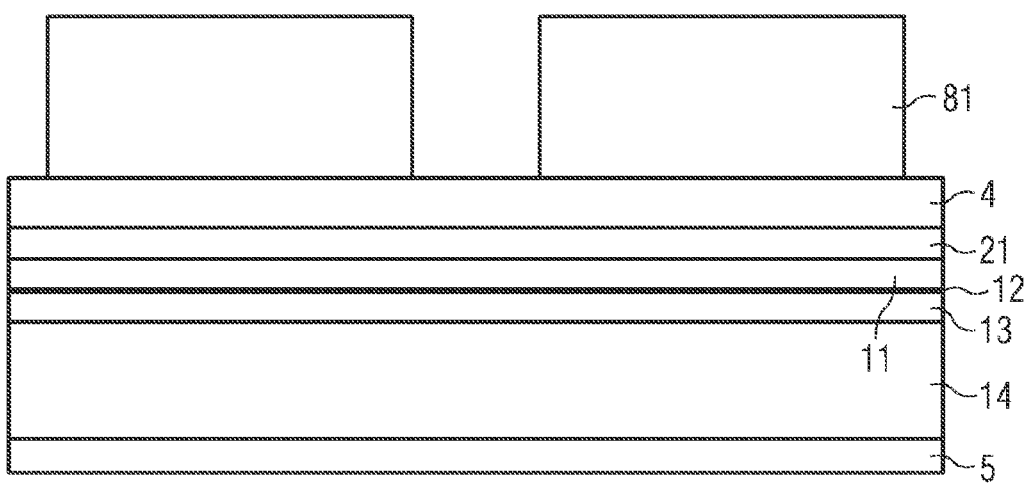
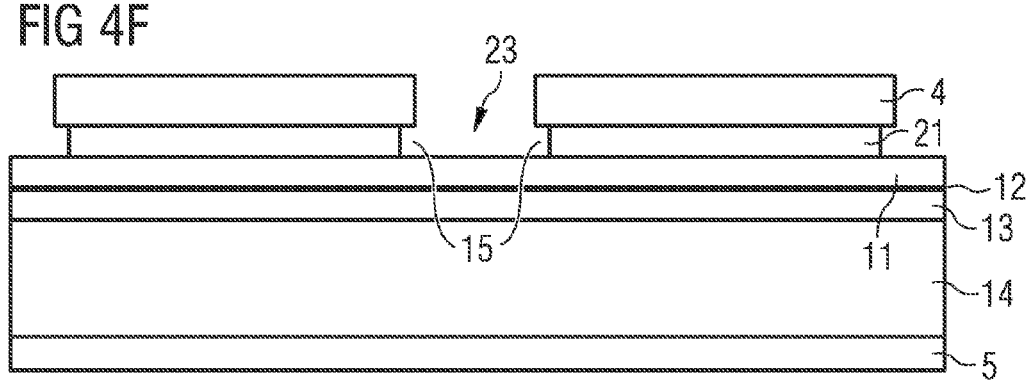

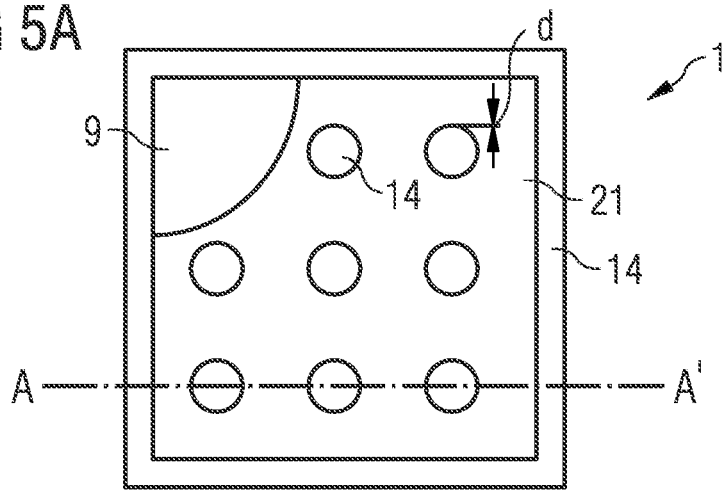
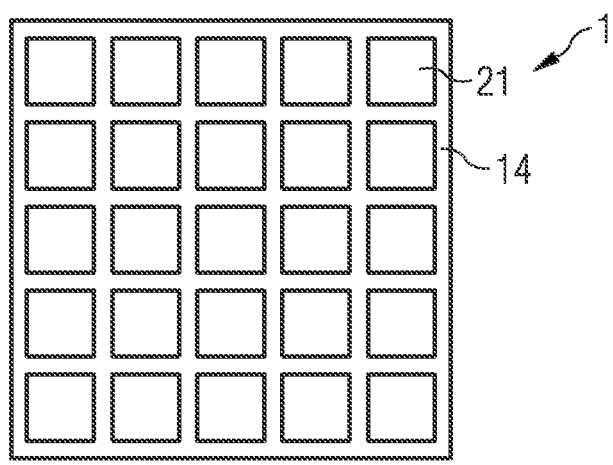
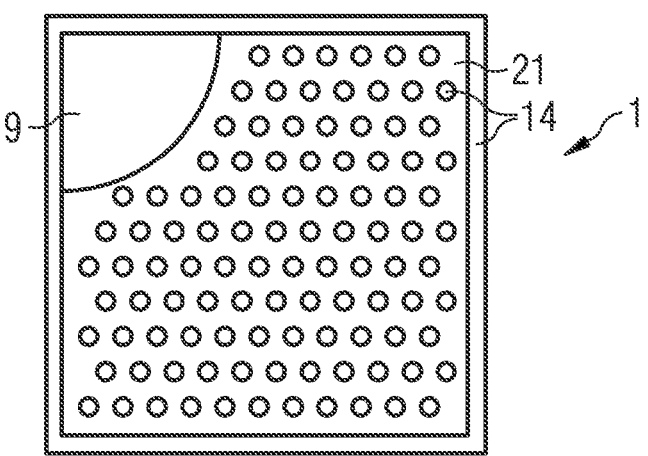

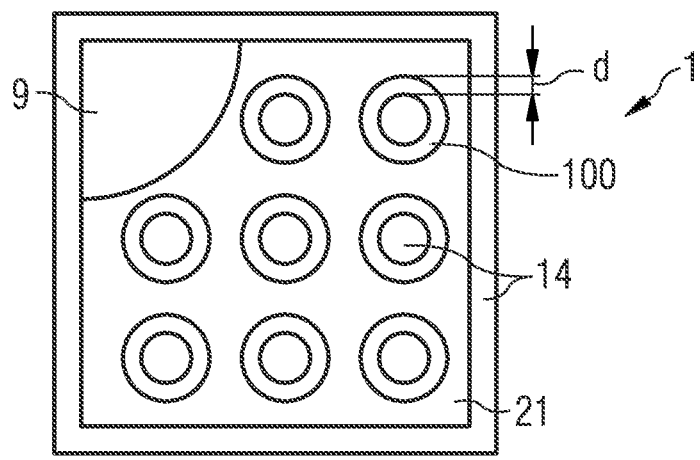

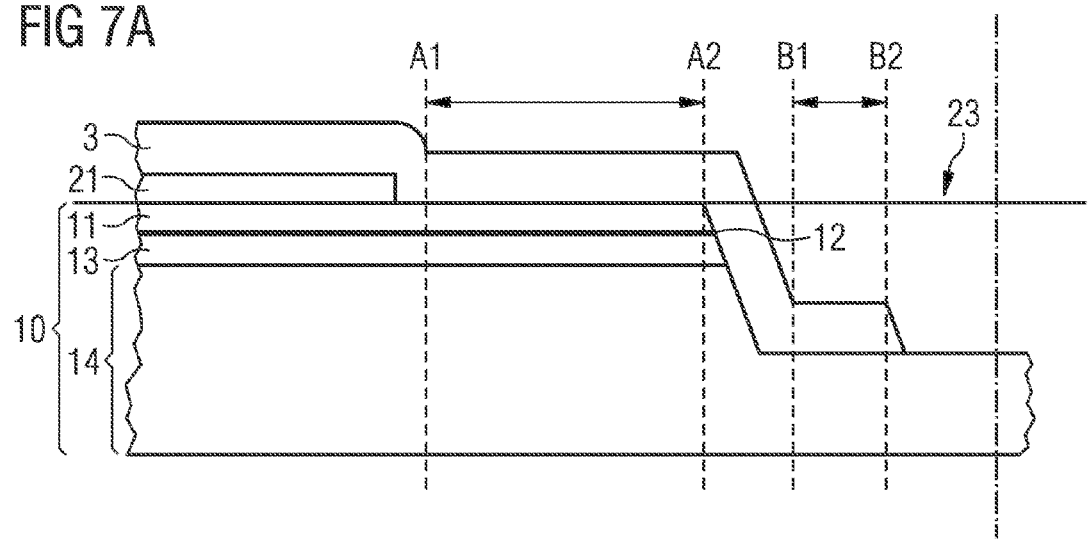
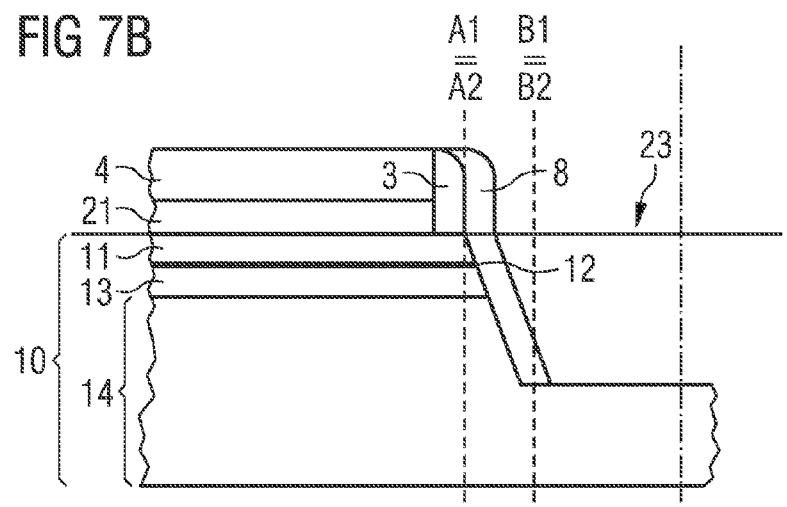
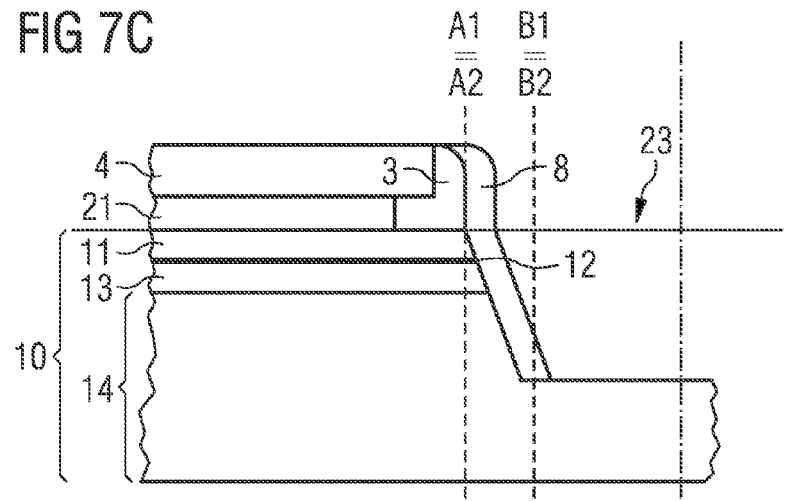

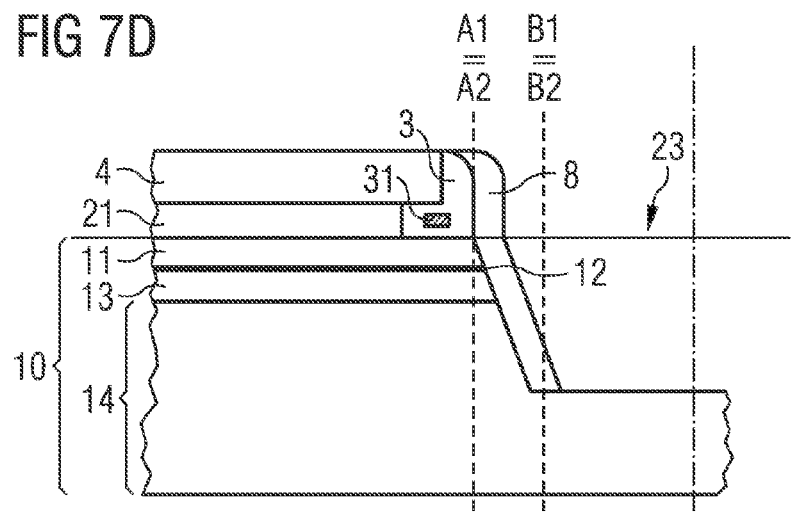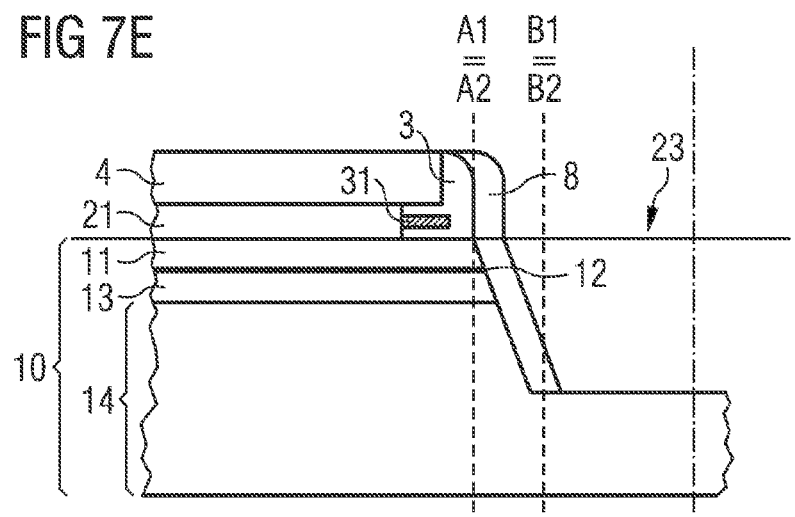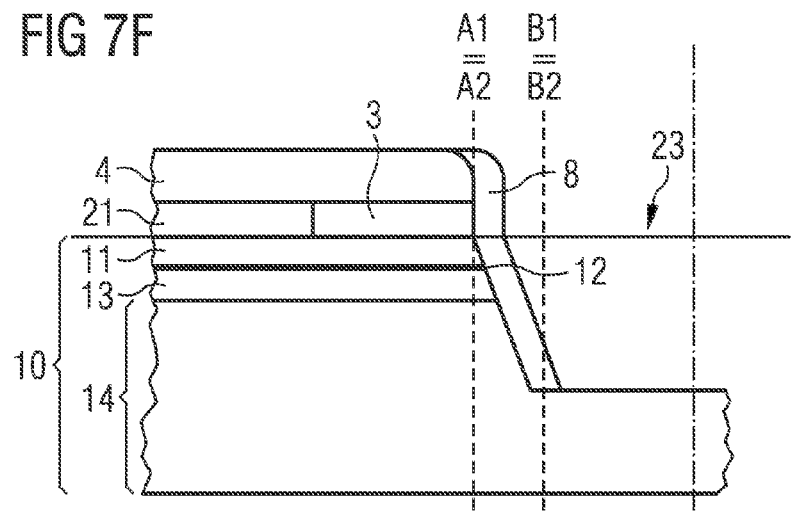

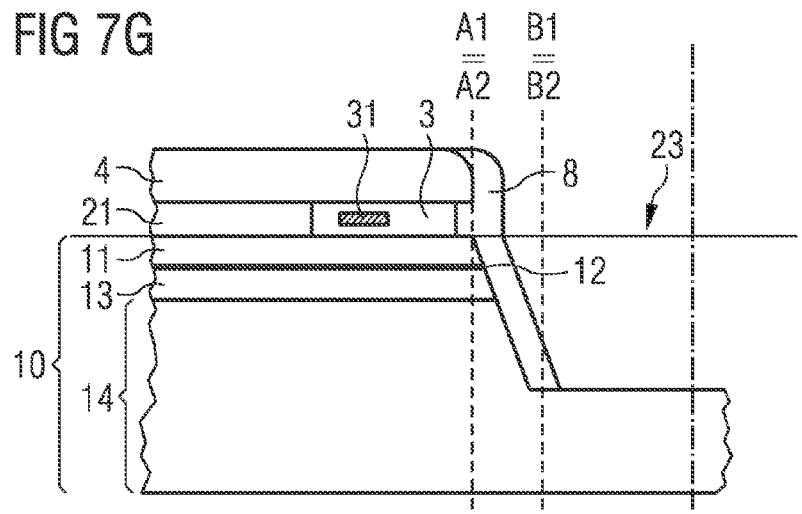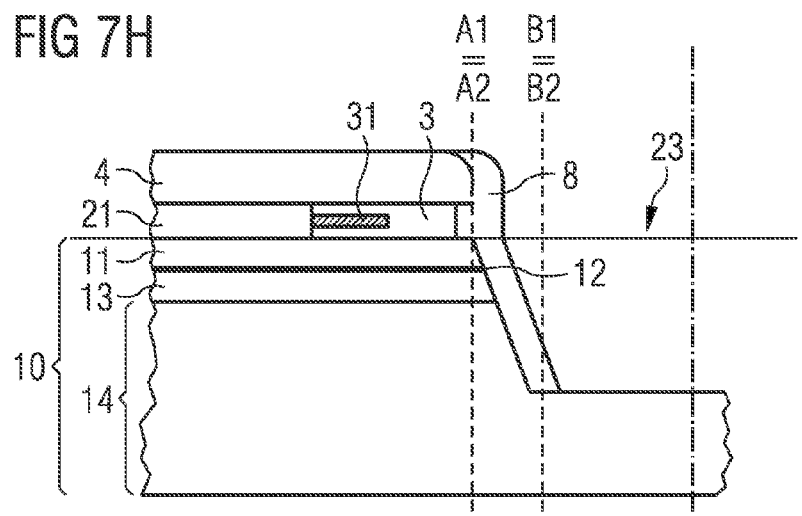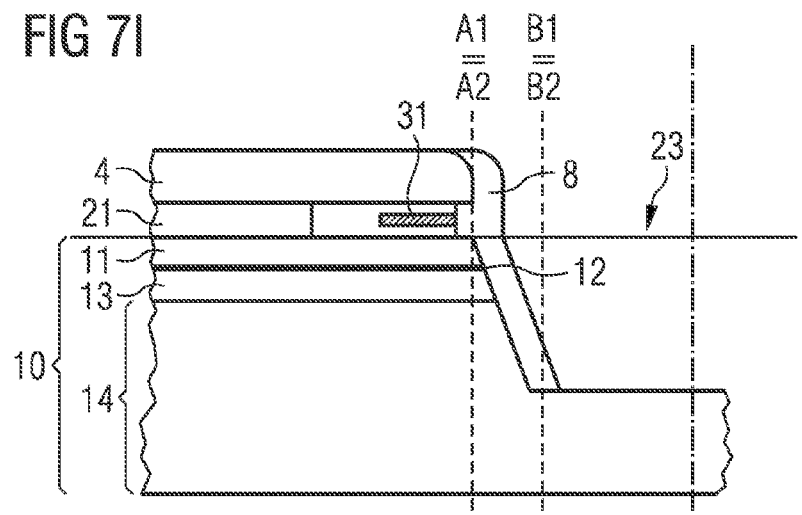

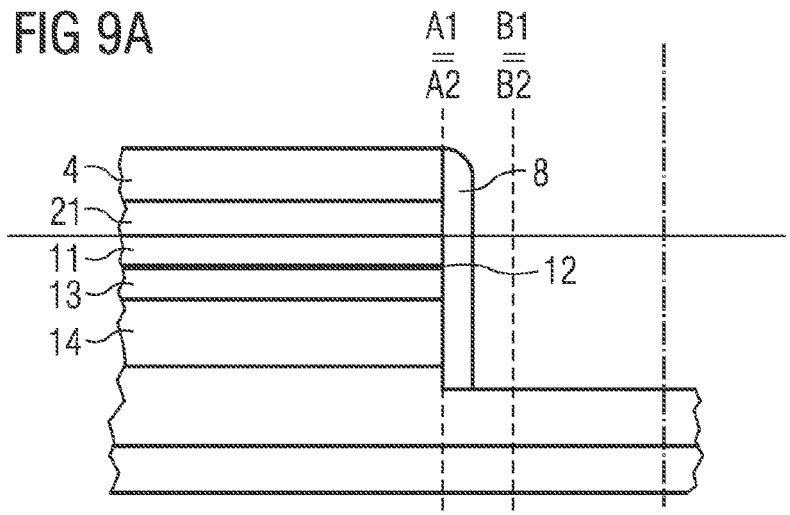
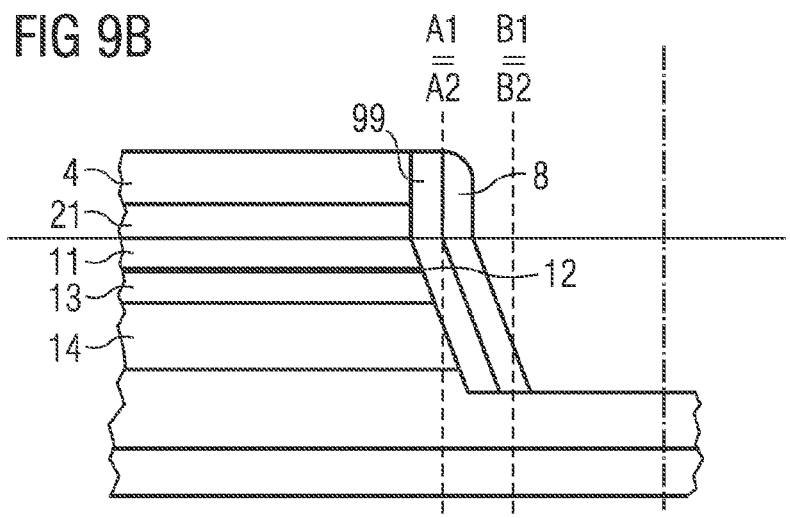
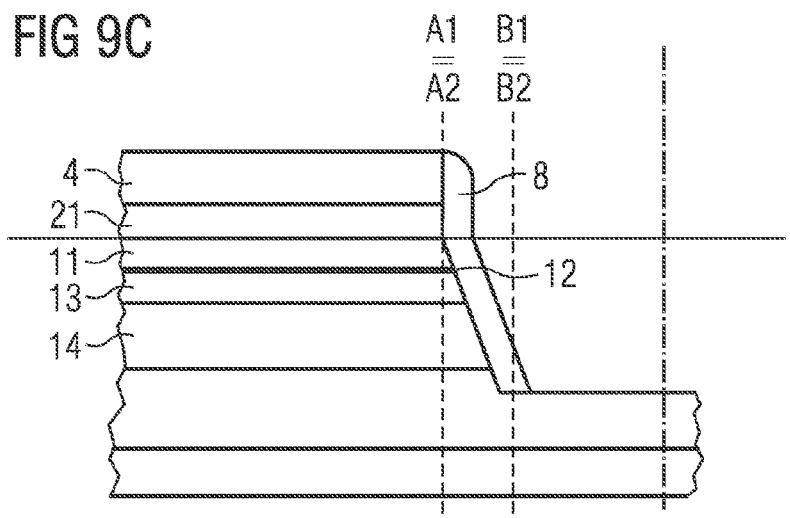

METHOD FOR PRODUCING AN OPTOELECTRONIC SEMICONDUCTOR CHIP WITH REFLECTIVE ELECTRODE

This patent application is a national phase filing under section 371 of PCT/EP2013/067445, filed Aug. 22, 2013, which claims the priority of German patent application 10 2012 107 921.8, filed Aug. 28, 2012, each of which is incorporated herein by reference in its entirety.

TECHNICAL FIELD

A method is specified for producing an optoelectronic semiconductor chip.

BACKGROUND

One problem to be solved is specifying a method for producing an optoelectronic semiconductor chip, in which a particularly large fraction of an active area of the semiconductor chip can be used in the finished semiconductor chip.

SUMMARY OF THE INVENTION

According to at least one embodiment of the method, an optoelectronic semiconductor chip is produced using the method. The optoelectronic semiconductor chip can be a radiation-receiving semiconductor chip, for example, a photodiode or a solar cell. Furthermore, it is possible that the optoelectronic semiconductor chip is a light-emitting semiconductor chip, for example, a light-emitting diode chip.

Using the method, in particular an optoelectronic semiconductor chip can be produced, which is free of metallic current spreading webs and is free of electrical contact points, for example, bond pads, on its top side, through which electromagnetic radiation to be received or generated passes in operation, for example. The risk of shading and/or absorption of a part of the electromagnetic radiation by the electrical contact points is reduced in this manner. Complex method steps in conjunction with the production of such contact points, for example, polishing the top side of the semiconductor chip and/or producing metal webs for current spreading, and/or measures which restrict or prevent the current injection into regions of the optoelectronic semiconductor chip below the electrical contact points, for example, the implementation of an electrically insulating layer, a Schottky barrier, and/or an ion-implanted region below the contact point, can advantageously be omitted in this manner. Such semiconductor chips are described, for example, in the document US 2010/0171135 A1, which is hereby expressly incorporated by reference.

According to at least one embodiment of the optoelectronic semiconductor chip, firstly a semiconductor layer sequence is provided. The semiconductor layer sequence is epitactically deposited on a growth substrate, for example. The growth substrate can be, for example, formed using sapphire or silicon. At least one n-conductive semiconductor region, an active region, and a p-conductive semiconductor region, for example, are epitactically grown on the growth substrate. The active region can be provided in this case in the finished optoelectronic semiconductor chip for receiving or generating electromagnetic radiation. Furthermore, the semiconductor layer sequence can comprise further semiconductor regions, for example, buffer regions for crystallographic adaptations, etch stop layers, sacrificial layers, current spreading layers, and contact layers.

According to at least one embodiment of the method, subsequently a metallic mirror layer is arranged on a top side of the semiconductor layer sequence facing away from the growth substrate, for example. At least one metallic mirror layer is arranged in this case. It is possible in this case that a mirror layer sequence is arranged, which comprises the at least one metallic mirror layer. The mirror layer sequence can comprise metallic layers, for example, made of pure metals or metal alloys. Furthermore, the mirror layer sequence can comprise doped metal oxides and/or ceramic materials. The metallic mirror layer can directly adjoin the semiconductor layer sequence in this case, or further layers, which are to prevent a diffusion of material of the metallic mirror layer into the semiconductor layer sequence and/or which improve an electrical contact between the metallic mirror layer and the semiconductor layer sequence, for example, are arranged between the semiconductor layer sequence and the metallic mirror layer. These additional layers are then formed using a material which is transmissive for the electromagnetic radiation to be received or generated in operation or these additional layers have openings, through which the electromagnetic radiation can reach the mirror layer.

In a subsequent method step, a mirror protection layer is arranged at least on exposed lateral surfaces of the mirror layer. For example, the metallic mirror layer is arranged for this purpose in a structured manner on the top side of the semiconductor layer sequence, such that the metallic mirror layer has a plurality of regions spaced apart from one another, which are separated from one another by trenches, in which no material of the metallic mirror layer is present. The individual regions of the metallic mirror layer are then delimited by exposed lateral surfaces in the lateral directions. The lateral directions extend, for example, in this case in a plane which extends in parallel to the main extension plane of the growth area of the growth substrate or the semiconductor layer sequence. The lateral surfaces of the metallic mirror layer, which are exposed, can extend perpendicularly or transversely to these main extension planes and therefore to the lateral directions.

According to at least one embodiment of the method, the semiconductor layer sequence is removed at points in a next method step. The removal of the semiconductor layer sequence can be performed using a chemical process such as etching, for example, wherein the mirror protection layer protects regions of the metallic mirror layer, which it covers, during the removal of the semiconductor layer sequence. The mirror protection layer can directly adjoin the metallic mirror layer, i.e., can be in direct contact with the metallic mirror layer.

According to at least one embodiment of the method, the mirror layer has openings toward the semiconductor layer sequence, which are framed in the lateral directions by the mirror protection layer, i.e., the openings are delimited in the lateral directions by the exposed lateral surfaces of the mirror layer, which are in turn covered by the mirror protection layer, so that the mirror protection layer frames the openings in the lateral direction. In this case, the mirror protection layer preferably completely covers the lateral surfaces of the metallic mirror layer, so that the metallic mirror layer is not exposed at any point at least on the lateral surfaces in the scope of the production tolerance.

According to at least one embodiment of the method, the partial removal of the semiconductor layer sequence is performed in the region of the openings of the mirror layer. This means that the material of the semiconductor layer sequence is removed through the openings. Proceeding from the openings in the mirror layer, after the removal of the semiconductor layer sequence, a recess or an opening extends into the semiconductor layer sequence. In this case, however, the semiconductor layer sequence is not completely penetrated, but rather the recess or opening in the semiconductor layer sequence only extends up to a determined penetration depth, which is at most 80% of the thickness of the semiconductor layer sequence, for example. In other words, by way of the partial removal of the semiconductor layer sequence in the region of the openings, the growth substrate is not exposed, but rather a base surface of the recess or opening in the semiconductor layer sequence, which is created through the opening of the mirror layer, is formed by material of the semiconductor layer sequence, for example, by a buffer layer.

According to at least one embodiment of the method, the arrangement of the mirror protection layer on the exposed lateral surfaces of the mirror layer is performed in a self-aligning manner. In other words, a lateral wall matching of the mirror is created, without a photo-technology or another method, in which an alignment in relation to the lateral surfaces of the mirror layer is necessary, for example, taking place. This means that, because of the self-aligning process during the arrangement of the mirror protection layer on the exposed lateral surfaces of the mirror layer, in particular a mask technology, in which, for example, a photoresist is exposed aligned to the location of the exposed lateral surfaces of the mirror layer, can be omitted. The arrangement of the mirror layer is thus performed in particular via a process step which is free of a mask technology or photo-technology.

According to at least one embodiment of the method for producing an optoelectronic semiconductor chip, the method comprises at least the following steps:

providing a semiconductor layer sequence, arranging a metallic mirror layer on a top side of the semiconductor layer sequence, arranging a mirror protection layer at least on exposed lateral surfaces of the mirror layer, partially removing the semiconductor layer sequence, wherein the mirror layer has openings toward the semiconductor layer sequence, which are framed in the lateral directions by the mirror protection layer, the partial removal of the semiconductor layer sequence is performed in the region of the openings of the mirror layer, the arrangement of the mirror protection layer on the exposed lateral surfaces of the mirror layer is performed in a self-aligning manner.

The method can comprise further method steps chronologically before or after the method steps described here and method steps which are carried out between the mentioned method steps. The specified sequence of the method steps is preferred in this case.

According to the method described here, before the partial removal of the semiconductor layer sequence in the region of the openings of the mirror layer, a mirror protection layer is applied in a self-aligning manner to the exposed lateral surfaces of the mirror layer.

Alternatively, it would be possible to use, for example, two separate photo-technologies for structuring the metallic mirror layer and partially removing the semiconductor layer sequence. For reliable alignment, the two masks required for this purpose must then have an offset of typically several micrometers to one another, which can result in a relatively high area loss, i.e., the active region can protrude in this case very far in the lateral directions, by several micrometers, beyond the exposed lateral surfaces of the metallic mirror layer. No radiation is generated for a radiation-generating optoelectronic semiconductor chip in the active region in the region of the protrusion.

Using the method described here, it is possible to reduce the lateral protrusion of the active region beyond the lateral surfaces of the metallic mirror layer and therefore enlarge the usable area of the active region. This results in an enlargement of the energized semiconductor area and therefore in greater light generation. If the size of the recesses in the mirror metal can be maintained, the possibility then alternatively exists of enlarging the terminal area of the through-contacts. The reduction of the transition resistance results in an increase of the electrical efficiency of the component. Furthermore, a combined utilization of both action mechanisms can also be sought.

Furthermore, the method proposed here for producing an optoelectronic semiconductor chip is particularly material-protective for the individual layers of the semiconductor chip, whereby, for example, damage to the metallic mirror layer and/or the semiconductor layer sequence can be prevented. With the method described here, fewer contaminants arise on the optoelectronic semiconductor chip than is the case with conventional methods. Furthermore, no crystal defects are created in the semiconductor layer sequence, for example, by sputtering processes. Finally, the method is particularly time-saving, in particular because of the omission of a further photo-technology, and can therefore be carried out particularly cost-effectively.

According to at least one embodiment of the method, the following method steps are executed for the self-aligning arrangement of the mirror protection layer on the exposed lateral surfaces of the mirror layer:

Firstly, the mirror protection layer is arranged on the top side of the mirror layer facing away from the semiconductor layer sequence, wherein the mirror protection layer has openings toward the mirror layer. This means that the mirror protection layer still does not cover the lateral surfaces of the metallic mirror layer in this method step, but rather it covers the mirror layer at points on its side facing away from the semiconductor layer sequence. The mirror protection layer has openings toward the mirror layer, through which openings can be created in the mirror layer. It is possible in this case that the mirror protection layer is arranged directly or indirectly on the top side of the mirror layer. If the mirror protection layer is arranged directly on the top side, it is thus in direct contact with the metallic mirror layer on the top side thereof. In the case of an indirect arrangement, at least one further layer is located between the metallic mirror layer and the mirror protection layer, which can completely cover the metallic mirror layer on its top side facing away from the semiconductor layer sequence, for example.

According to at least one embodiment of the method, the metallic mirror layer is removed at points in the region of the openings of the mirror protection layer to create the openings in the mirror layer. The removal can be performed, for example, by a wet-chemical method such as wet-chemical etching, wherein the mirror protection layer is used as a mask for the method during the removal. During the removal of the mirror layer through the openings of the mirror protection layer, the metallic mirror layer is removed such that the mirror protection layer arranged on the top side of the mirror layer protrudes beyond exposed lateral surfaces of the mirror layer in the lateral direction. For example, the mirror protection layer is used as an etching mask, to draw the mirror layer behind the lateral surfaces of the mirror protection layer using a wet-chemical etching step.

In a further method step, the mirror protection layer is softened such that at least a part of the mirror protection layer, which protrudes beyond the lateral surfaces of the mirror layer in the lateral direction, flows along the lateral surfaces of the mirror layer and covers them after the flowing. This means that, for example, due to a heat treatment, the mirror protection layer is softened and can deform, for example, following gravity. The exposed lateral surfaces of the metallic mirror layer are thus encapsulated with the mirror protection layer and are protected thereby during the subsequent structuring of the semiconductor layer sequence. No additional protection layer is required during this method. The flowing of the softened mirror protection layer along the lateral surfaces of the mirror layer can be assisted by gravity, electrostatic forces, capillary forces, and/or centrifugal forces. It is possible in this case that the semiconductor layer sequence is arranged, for example, in an electrical field and/or a centrifuge.

It could be considered to be disadvantageous in this method that the required mirror withdrawal, i.e., the protrusion of the mirror protection layer beyond the exposed lateral surfaces of the mirror layer in the lateral directions, is relatively large and therefore the minimum distance between the lateral surfaces of the mirror layer and the opening in the semiconductor layer sequence is limited.

According to at least one embodiment of the method, the mirror protection layer is formed using a material which can be photo-structured. This means that the mirror protection layer can involve a photoresist in particular. This has the advantage that the openings in the mirror protection layer toward the mirror layer can be created particularly simply. Furthermore, a material which can be photo-structured is particularly suitable for flowing along the lateral surfaces of the mirror layer upon softening, for example, due to heating.

According to at least one embodiment of the method, for the self-aligning arrangement of the mirror protection layer on the exposed lateral surfaces of the mirror layer, the following method step is executed: A conforming deposition of the mirror protection layer is performed on the top side of the mirror layer facing away from the semiconductor layer sequence and the exposed lateral surfaces of the mirror layer. Via this method, very small distances are enabled between the exposed lateral surfaces of the metallic mirror layer and the openings in the semiconductor layer sequence. By way of the deposition of the mirror protection layer, the mirror layer is covered both on its side facing away from the semiconductor layer sequence and also on its exposed lateral surfaces with the material of the mirror protection layer with uniform thickness. For this purpose, in particular methods such as plasma-assisted chemical gas phase deposition, atomic layer deposition, or chemical gas phase deposition can be used. In particular atomic layer deposition (also called ALD) is particularly suitable for depositing a particularly dense mirror protection layer in a conforming manner.

SiO2 layers which are somewhat less conforming and dense, but have particularly high deposition rates in exchange, can alternatively be created by a PECVD method upon the application of the precursor material tetraethyl orthosilicate (TEOS). According to at least one embodiment of the method, the mirror protection layer is formed using an oxide or a nitride. For example, the mirror protection layer can comprise a silicon oxide, a silicon nitride, an aluminum nitride, an aluminum oxide, and/or a titanium oxide. Various methods can also be combined to implement the mirror protection layer. For example, a less dense layer can be combined with an ALD layer.

In this method, it can be advantageous for an intermediate protection layer, which does not cover the exposed lateral surfaces of the mirror layer, to be applied to the top side of the mirror layer before the application of the mirror protection layer. The material of the intermediate protection layer is used as a cover material. This intermediate protection layer can be suitable for the purpose of protecting the underlying mirror layer during the application of the mirror protection layer from damage due to, for example, high-energy material or reactive ions or gases of the mirror protection layer.

After the conforming deposition of the mirror protection layer, it is completely back-etched in the surface. In particular, the most anisotropic possible methods are selected for this purpose, for example, dry-chemical etching using reactive ions or solely mechanical back-sputtering processes. In order that as little as possible of a possible intermediate protection layer is removed, endpoint recognition for the process presents itself. Due to the anisotropic etching behavior, the material of the mirror protection layer is only maintained at layer steps and self-aligned openings form for the later etching of the semiconductor material.

Alternatively, the opening of the mirror protection layer can be omitted if, using a shared photomask, the mirror layer or the mirror layer stack and the mirror protection layer are structured via lift-off methods. In this case, the mirror protection layer would also assume the function of an intermediate protection layer. For the lift-off method, low-temperature methods are required in this case for depositing the dielectric material. This can be performed by CVD, PECVD, vapor deposition, or sputtering. The temperature stress of the resist, which is to be at most 200° C. to 220° C., is critical. The mirror layer should be deposited with the most targeted possible methods (for example, by vapor deposition) and the mirror protection layer should be deposited with the least targeted possible methods (for example, by low-temperature CVD, sputtering). Complete coverage of the mirror layer by the mirror protection layer is thus achieved.

The resulting distance between the lateral surfaces of the mirror layer and the corresponding openings in the semiconductor layer sequence is in the range of the thickness of the mirror protection layer in the case of this method. It is advantageously possible that at least a part of the intermediate protection layer and/or mirror protection layer can remain in the further method sequence as an electrically insulating layer in the semiconductor component. In this manner, it is possible that the method makes the application of an insulation layer required in any case superfluous as an additional method step and thus enables a particularly time-saving and cost-effective production of the optoelectronic semiconductor chip. A gas-tight encapsulation of the mirror can be formed by the intermediate protection layer and/or the mirror protection layer.

Furthermore, it is advantageous that a gas-tight encapsulation of the mirror is already deposited and is checked for leak-tightness by subsequent dry-chemical etching processes. Since, in case of a leak, a noticeable mirror corrosion occurs, this point can be located easily by optical inspection.

According to at least one embodiment of the method, before the self-aligning arrangement of the mirror protection layer on the exposed lateral surfaces of the mirror layer, at least one intermediate protection layer is arranged on the top side of the mirror layer facing away from the semiconductor layer sequence.

During the self-aligning arrangement of the mirror protection layer on the exposed lateral surfaces of the mirror layer, exposed lateral surfaces of the at least one intermediate protection layer are then also covered by the mirror protection layer. The intermediate protection layer and the mirror protection layer can be formed from identical or different materials in this case. The intermediate protection layer can protect the mirror layer from damage in particular during the procedure of the application of the mirror protection layer.

For example, the intermediate protection layer is formed using an oxide or a nitride, in particular using at least one of the following materials: a silicon oxide, a silicon nitride, an aluminum oxide, an aluminum nitride, or a titanium oxide.

The intermediate protection layer can be implemented to be thicker than the actual mirror layer in particular in this case. For example, the intermediate protection layer has a thickness of at least 200 nm, while in contrast the metallic mirror layer has a thickness of less than 200 nm. Alternatively, however, it is also possible that the intermediate protection layer is thinner than the mirror layer. It is important for the thickness of the intermediate protection layer that it is and remains chemical-tight if this layer is thinned due to slight overetching during the subsequent etching processes.

The intermediate protection layer has proven to be particularly advantageous for protecting the mirror layer from damage during the deposition in particular in the case of a method in which the mirror protection layer is deposited in a conforming manner.

According to at least one embodiment of the method, the mirror layer comprises silver and the partial removal of the semiconductor layer sequence is performed by etching using a halide-containing material. In this case, it is possible in particular that the metallic mirror layer consists of silver. Silver is distinguished by its high reflectivity to light in the visible spectral range. However, silver can be attacked by a variety of chemical materials and loses its preferred optical properties in this case. For example, silver is very sensitive in relation to halogens such as fluorine and chlorine. However, these halogens are preferably used for dry-chemical structuring of the semiconductor layer sequence or for structuring insulating layers, which are formed using silicon dioxide, for example. The partial removal of the semiconductor layer sequence is thus preferably performed by dry chemistry using a chlorinated etching agent.

Alternatively or additionally to silver, the mirror layer can also be formed using another metal, for example, aluminum, gold, or rhodium. These metals are also sensitive in relation to halogens and can lose their good reflective properties in contact with halogens. Gold is particularly suitable for the reflection of electromagnetic radiation from the red/infrared spectral range.

The mirror protection layer is selected in the present case such that it is suitable for withstanding a dry-chemical etching agent, which contains a halide.

According to at least one embodiment of the method, during the partial removal of the semiconductor layer sequence, an active region in the semiconductor layer sequence is penetrated and lateral surfaces of the active region are exposed. This means that the partial removal of the semiconductor layer sequence is used for the purpose of creating a passage through the active region. For example, by way of the removal, a recess or an opening is created in the semiconductor layer sequence, which extends through a p-conductive semiconductor layer and an active region down into an n-conductive semiconductor layer or beyond. Via the recess or opening produced in this manner in the semiconductor layer sequence, contacting of the semiconductor layer can then be performed, which is arranged on the side facing away from the mirror layer of the active region of the semiconductor layer sequence.

After the exposure of the lateral surfaces of the active region, a further protection layer is preferably arranged on the exposed lateral surfaces of the active region in a self-aligning manner, i.e., in addition to the self-aligning arrangement of the mirror protection layer on the exposed lateral surfaces of the mirror, in a subsequent method step, a self-aligning arrangement of a further protection layer is performed on the exposed lateral surfaces of the active region within the recess or opening, which extends through the semiconductor layer sequence. This results in a self-aligned passivation of the exposed pn-junction in the through-contacts. The further protection layer is used in particular as a semiconductor passivation layer and can directly adjoin a semiconductor material at points.

According to at least one embodiment of the method, the self-aligning arrangement of the further protection layer is performed by a conforming deposition of the further protection layer on the top side of the mirror layer facing away from the semiconductor layer sequence and the exposed lateral surfaces of the active region. In particular, it is thus possible that the further protection layer extends along the entire recess or opening in the semiconductor layer sequence and in particular also covers a base surface of this recess or opening. The conforming deposition can again be performed by means of one of the above-mentioned methods. In particular, oxides or nitrides such as silicon dioxide, $Si_3N_4$, and/or $Al_2O_3$ can again be used as the material for the further protection layer. In this case, it is possible in particular that layer stacks made of this material are also used, wherein different layers of the layer stack can be formed using different materials.

For the local removal of the further protection layer, for example, on the base surfaces of the recesses or openings created by the partial removal of the semiconductor layer sequence, an anisotropic etching step can be performed, which is performed, for example, by means of plasma etching, for example, by means of F-RIE. During the etching process, an endpoint recognition is preferably performed, to remove as little as possible of the possibly provided intermediate protection layer.

According to at least one embodiment of the method, a semiconductor buffer region in the semiconductor layer sequence is exposed on the side of the active region facing away from the mirror layer. In particular, an electrical terminal layer in the semiconductor layer sequence is exposed, which is part of the semiconductor buffer region, which is used as a crystallographic adaptation layer between the growth substrate and the actual active zone. The semiconductor buffer region can be doped or undoped, for example. In particular, it is possible that the semiconductor buffer region is implemented as n-conductive, for example. An electrically conductive material, which can extend along the further protection layer, is applied to the exposed semiconductor buffer region, i.e., for example, the electrical terminal layer, wherein the further protection layer in particular electrically insulates the lateral surfaces of the active region from the electrically conductive material, so that no short-circuit is created in particular at the pn-junction of the semiconductor layer sequence by the electrically conductive material. In other words, the further protection layer then forms an electrically insulating layer for electrically insulating a through-contact through the active region, which extends, for example, from the n-conductive side of the semiconductor layer sequence into the p-conductive side of the semiconductor layer sequence. In this manner, it is possible to create contacting, for example, of the p-conductive side or the n-conductive side of the semiconductor body, without a contact surface having the above-mentioned disadvantages having to be arranged on a radiation passage surface of the optoelectronic semiconductor chip.

According to at least one embodiment of the method described here, the active region and/or the intermediate protection layer, after the exposure of the lateral surfaces of the active region, protrudes beyond the mirror layer in the lateral directions, wherein the active region and/or the intermediate protection layer protrudes beyond the mirror layer by at most 2000 nm, in particular by at most 1000 nm. This means that the area of the active region, which is not usable in particular for radiation generation, between the lateral surfaces of the metallic mirror layer and the lateral surface of the active region is kept very small.

According to at least one embodiment of the method described here, the intermediate protection layer and/or the mirror protection layer remain in the finished optoelectronic semiconductor chip and is used for protecting and/or electrically insulating components of the semiconductor chip. It is possible in this case that the lateral surfaces of the semiconductor layer sequence are free of the mirror protection layer.

BRIEF DESCRIPTION OF THE DRAWINGS

The method described here will be explained in greater detail hereafter on the basis of exemplary embodiments and the associated figures.

A first exemplary embodiment of a method described here is explained in greater detail in conjunction with FIGS. 1A to 1J.

Figure 2A:
Figure 2B:
Figure 2C:
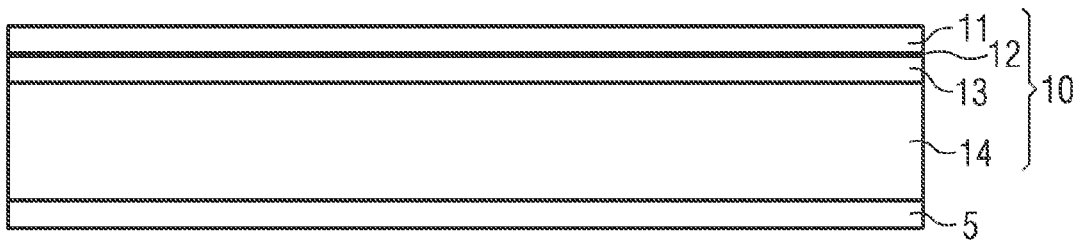
Figure 2D:
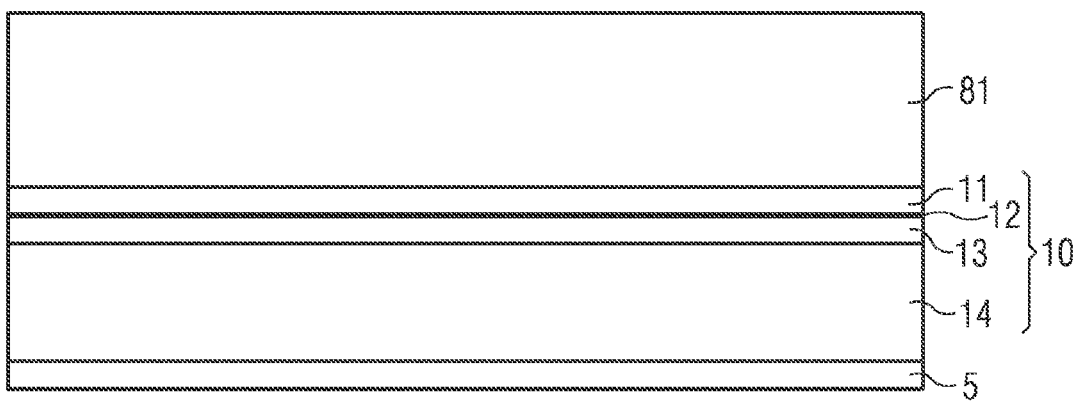
Figure 2N:
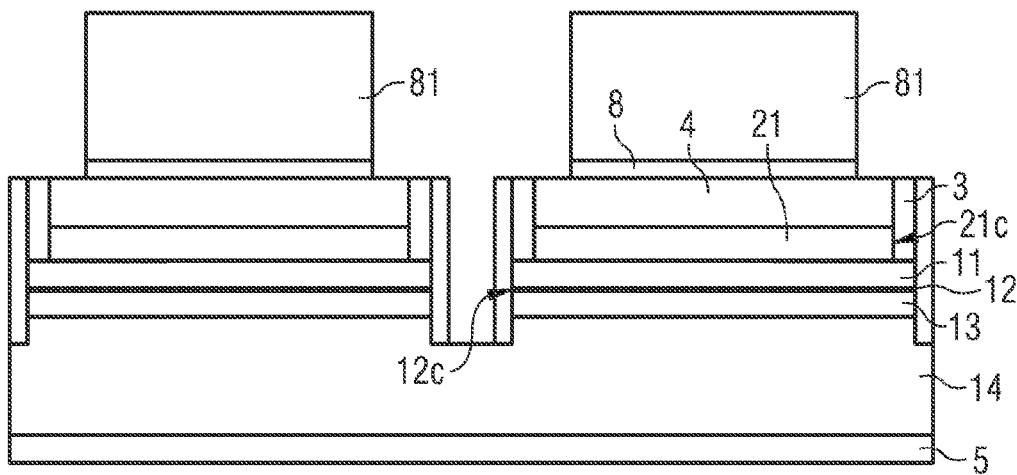
Figure 2O:
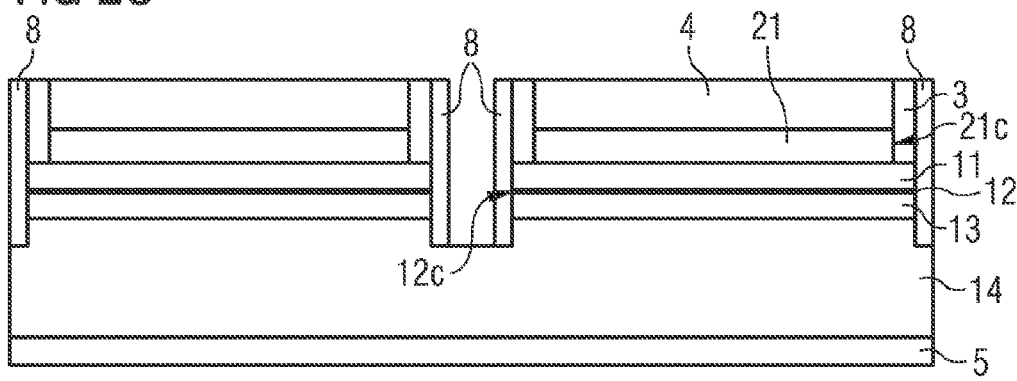
Figure 2P:
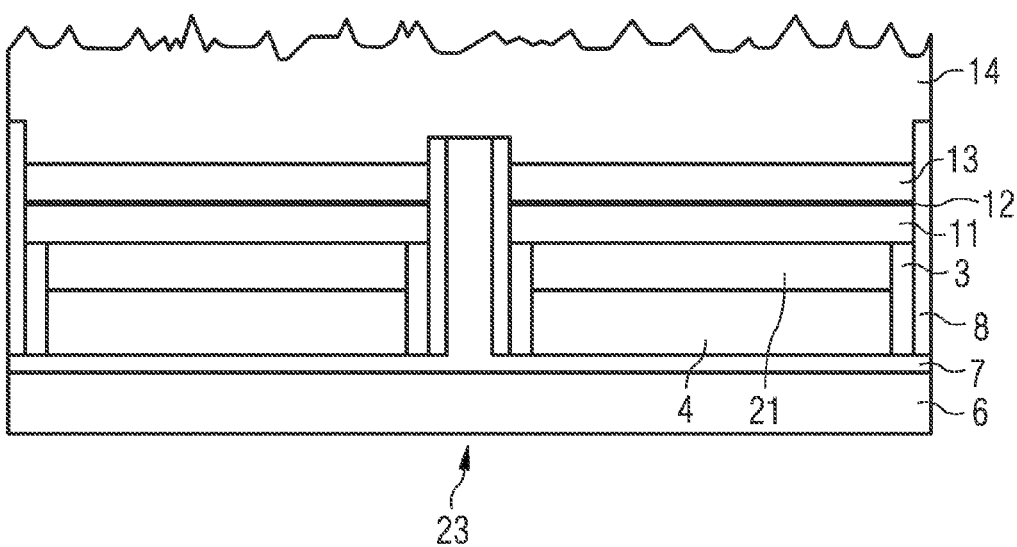

A further exemplary embodiment of a method described here is explained in greater detail in conjunction with FIGS. 2A to 2P.

A further exemplary embodiment of a method described here is explained in greater detail in conjunction with FIGS. 3A to 3K.

A further exemplary embodiment of a method described here is explained in greater detail in conjunction with FIGS. 4A to 4H.

FIGS. 5A to 5C show schematic illustrations of partial regions of the optoelectronic semiconductor chips, which are produced using a method described here.

FIG. 6 shows a schematic view of an optoelectronic semiconductor chip, which is not produced using the method described here.

FIGS. 7A to 7I show schematic illustrations of partial regions of optoelectronic semiconductor chips.

Figure 8A:
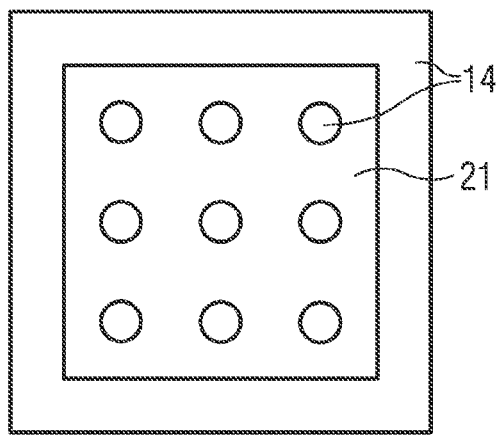
Figure 8B:
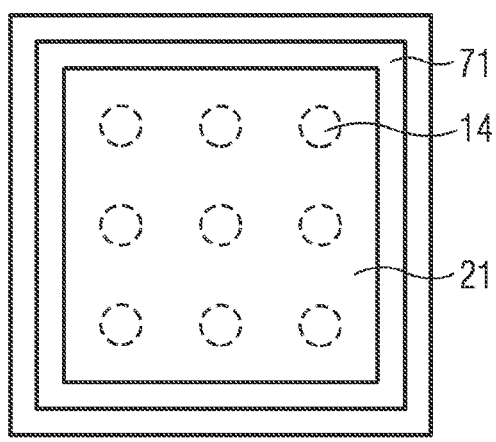
Figure 8C:
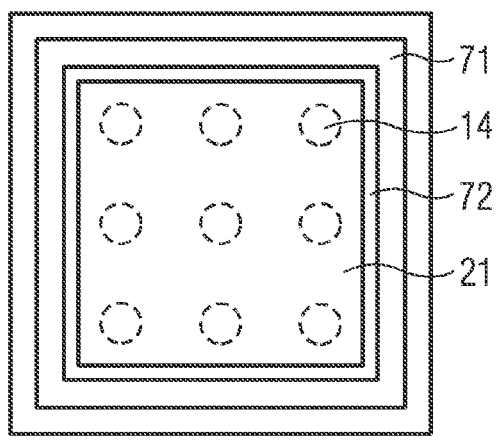

FIGS. 8A to 8C show schematic illustrations of partial regions of optoelectronic semiconductor chips, which are produced using a method described here.

FIGS. 9A to 9C show schematic illustrations of partial regions of optoelectronic semiconductor chips.

DETAILED DESCRIPTION OF ILLUSTRATIVE EMBODIMENTS

Identical, similar, or identically acting elements are provided with identical reference signs in the figures. The figures and the size ratios in relation to one another of the elements shown in the figures are not to scale. Rather, individual elements can be shown as exaggeratedly large for better illustration capability and/or for better comprehensibility. FIGS. 1 to 4 show details of a part of the optoelectronic semiconductor chip to be produced. The details can each be extended accordingly on the right and left sides of the sectional view.

Figure 1A:

A first exemplary embodiment of a method described here is explained in greater detail in conjunction with the schematic sectional views of FIGS. 1A to 1J. FIG. 1A shows a first method step, in which a semiconductor buffer region 14 is deposited on the top side of a growth substrate 5. For example, the growth substrate is a sapphire substrate or a silicon substrate, on which a semiconductor layer sequence 10, which is based on a nitride compound semiconductor material, for example, is deposited. For example, the semiconductor buffer region 14 is a layer which is formed using GaN.

Figure 1B:
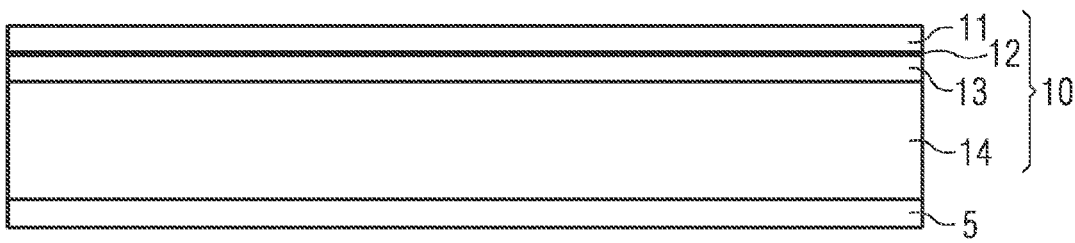

Subsequently, FIG. 1B, an n-doped region 13, an active region 12, and a p-doped region are epitactically deposited.

Figure 1C:
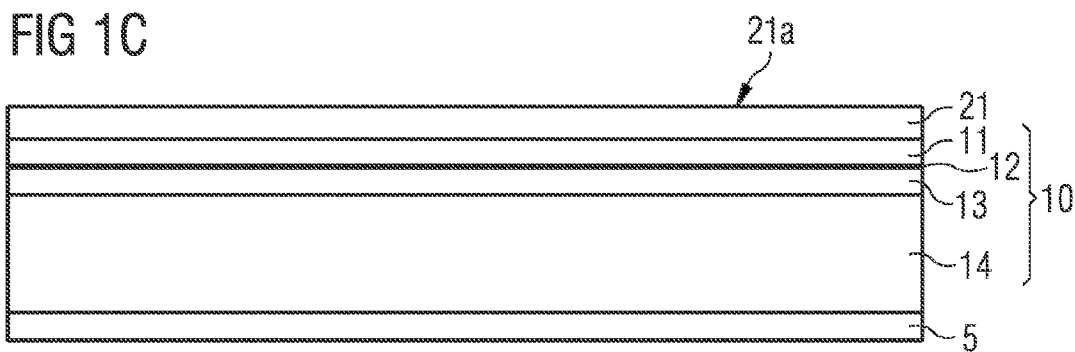

Subsequently, FIG. 1C, the arrangement of a metallic mirror layer 21 on the top side of the semiconductor layer sequence 10 facing away from the growth substrate 5 is performed. For example, the metallic mirror layer 21 is a silver mirror, which can have a thickness, for example, of at least 100 nm and at most 200 nm, in particular of approximately 140 nm. For example, the metallic mirror layer is vapor-deposited or sputtered on.

Figure 1D:
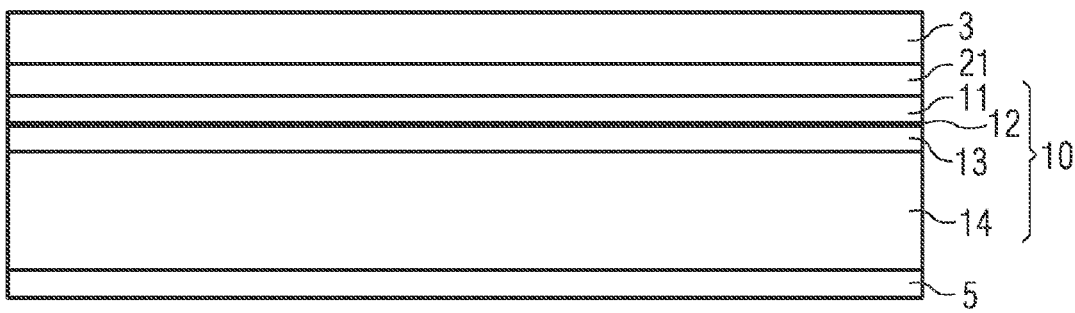

In a following method step, a mirror protection layer 3 is applied to the top side 21a of the metallic mirror layer 21. In the present case, the mirror protection layer 3 is a material which can be photo-structured, for example, a positive photoresist (FIG. 1D).

Figure 1E:
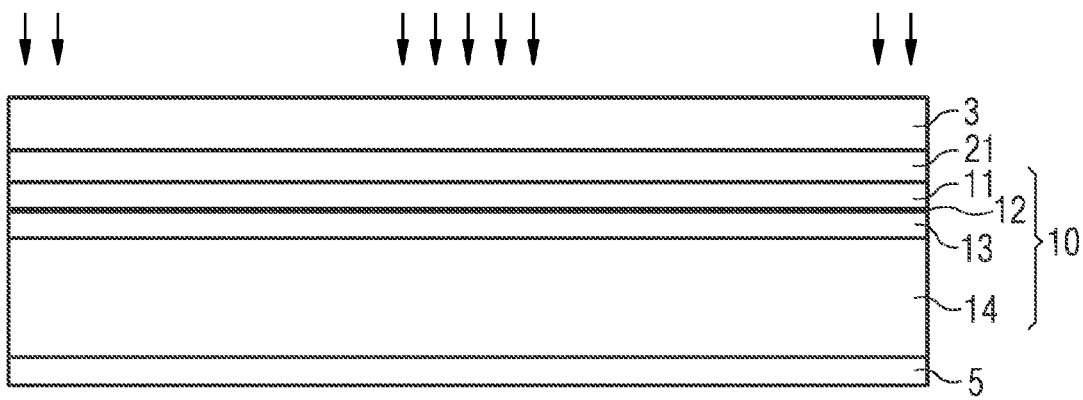
Figure 1F:
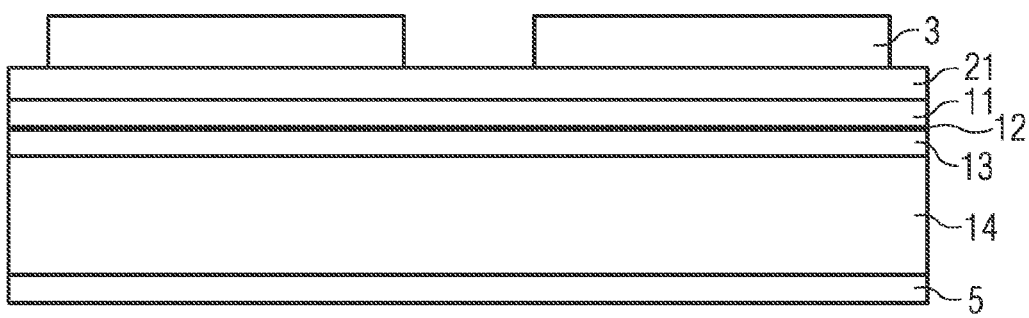

Subsequently, FIG. 1E, the protection layer 3 is exposed, for example, through a mask (not shown). In this manner, FIG. 1F, a structured mirror protection layer 3 is created.

Figure 1G:
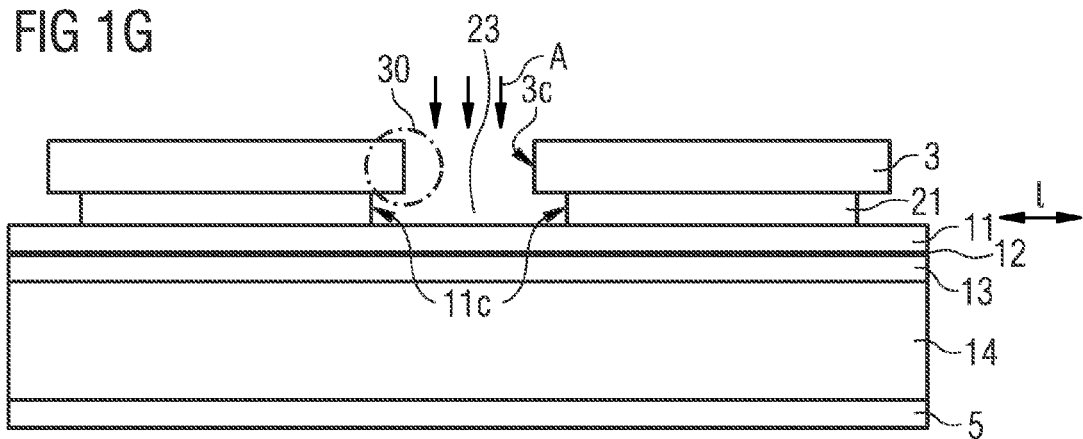

In the following method step, FIG. 1G, a wet-chemical etching step A is performed, during which the mirror layer 21 is drawn in the lateral directions 1 behind the lateral surfaces 3c of the protection layer 3, such that a part 30 of the mirror protection layer 3 protrudes in the lateral directions 1 beyond the exposed lateral surfaces 21c of the metallic mirror layer 21. Openings 23 in the mirror layer are created by the structuring of the mirror layer 21.

Subsequently, the mirror protection layer 3 is softened by heating, for example. At least the laterally protruding part 30 of the mirror protection layer 3 flows, for example, because of gravity, along the exposed lateral surfaces 21c of the mirror layer 21 in the direction of the semiconductor layer sequence 10, whereby the exposed lateral surfaces 21c are wetted by the mirror protection layer 3 and covered. The lateral surfaces 21c of the mirror layer 21 are now protected by the mirror protection layer 3, FIG. 1H.

Subsequently, a dry-etching step is performed, during which the material of the semiconductor layer sequence 10 is at least partially removed, so that a recess or opening results in the semiconductor layer sequence 10. In the region of the opening, the lateral surface 3c of the mirror protection layer 3, the lateral surface 11c of the p-conductive region, the lateral surfaces 12c of the active region, and the lateral surfaces 13c of the n-conductive region are each exposed.

In a further method step, which is explained in conjunction with FIG. 1J, the mirror protection layer 3 can be removed by stripping, for example. Subsequent method steps for contacting and finishing the optoelectronic semiconductor chip can be carried out as described in conjunction with FIGS. 2L to 2P, for example, which are explained hereafter.

A further exemplary embodiment of a method described here is explained in greater detail in conjunction with the schematic sectional views of FIGS. 2A to 2P.

Firstly, a growth substrate 5 is provided, on which, for example, a semiconductor buffer region 14 is epitactically deposited (FIG. 2A).

Subsequently, FIG. 2B, the semiconductor layer sequence 10 is epitactically supplemented with an n-conductive region 13, an active region 12, and a p-conductive region 11. For example, if the optoelectronic semiconductor chip is a radiation-generating semiconductor chip, electromagnetic radiation is thus generated in the active region 12 in the finished semiconductor chip.

In a following method step, FIG. 2C, the metallic mirror layer 21 is deposited on the top side of the semiconductor layer sequence 10 facing away from the semiconductor substrate 5.

A method step is described in conjunction with FIG. 2D, in which a photoresist layer 81, which is formed using a negative photoresist, for example, is applied, for example, spin-deposited onto the top side of the semiconductor layer sequence 10 facing away from the growth substrate 5.

In a following method step, FIG. 2E, the photoresist layer 81 is exposed and developed to form the photomask 81, see FIGS. 2E and 2F. In this way, regions in which the mirror layer 21 can be applied in structured form are structured through the photomask 81. After the application of the mirror layer 21 in the openings structured through the photomask 81 on the semiconductor layer sequence, the intermediate protection layer 4 is applied on the side facing away from the semiconductor layer sequence. The intermediate protection layer 4 is formed, for example, using a silicon dioxide formed from silane. Alternatively, the intermediate protection layer can also be vapor-deposited or sputtered on.

In a further method step, FIG. 2H, the photomask 81 is removed, so that the lateral surfaces 21c of the mirror layer 21 are exposed, i.e., the lateral surfaces 21c are freely accessible in the openings 23 of the mirror layer 21. In addition, the lateral surfaces 4c of the intermediate protection layer 4 are freely accessible.

In the next method step, FIG. 2I, the mirror protection layer 3 is deposited in a conforming manner on the top side of the intermediate protection layer 4 facing away from the growth substrate 5 and on the lateral surfaces of the intermediate protection layer 4 and the mirror layer 21. The intermediate protection layer 4 protects the mirror layer from damage during this deposition operation. Very small distances between the exposed lateral surfaces of the metallic mirror layer 21 and the openings created later in the semiconductor layer sequence 10 are enabled via the conforming deposition. Due to the conforming deposition of the mirror protection layer 3, the mirror layer 21 is covered with uniform thickness both on its side facing away from the semiconductor layer sequence 10 and also on its exposed lateral surfaces 21c with the material of the mirror protection layer 3. In particular, methods such as plasma-assisted chemical gas phase deposition, atomic layer deposition, or chemical gas phase deposition can be used for this purpose. In particular atomic layer deposition (also called ALD) is particularly suitable for depositing a particularly dense mirror protection layer 3 in a conforming manner. SiO2 layers which are somewhat less conforming and dense, but which have a particularly high deposition rate in exchange, can alternatively be created by a PECVD method upon the application of the precursor material tetraethyl orthosilicate (TEOS).

According to at least one embodiment of the method, the mirror protection layer is formed using an oxide or a nitride. For example, the mirror protection layer can comprise a silicon oxide, a silicon nitride, an aluminum nitride, and/or an aluminum oxide.

In the following method step, anisotropic etching is performed, wherein the mirror protection layer 3 is completely removed on the top side of the intermediate protection layer 4 facing away from the growth substrate 5 and the semiconductor layer sequence 10 is exposed in the opening 23 from the material of the mirror protection layer 3, FIG. 2J. The intermediate protection layer protects the mirror here from reactive and strongly accelerated chlorine and argon ions.

Subsequently, dry-chemical etching is performed, for example, using a halide such as chlorine, using which the semiconductor layer sequence is partially removed in the openings 23 of the mirror layer 21, so that on the base surface of the recess or opening thus created, for example, the semiconductor buffer region 14 in the opening 23 is exposed, FIG. 2K.

In the next method step, FIG. 2L, the further protection layer 8 is again deposited in a conforming manner such that the lateral surfaces 21c of the mirror layer 21 and the lateral surfaces of the active region 12 are covered by the further protection layer 8. This is shown in FIG. 2L.

In particular, it is thus possible that the further protection layer 8 extends along the entire recess or opening in the semiconductor layer sequence 10 and in particular also covers a base surface of this recess or opening.

The conforming deposition can again be performed by means of one of the above-mentioned methods. In particular, oxides or nitrides such as silicon dioxide, $Si_3N_4$, and/or $Al_2O_3$ can again be used as a material for the further protection layer 8. In this case, it is possible in particular that layer stacks made of this material are also used, wherein different layers of the layer stack can be formed using different materials.

A method step is described in conjunction with FIG. 2M, in which a photomask 81 is applied to the side of the further protection layer 8 facing away from the growth substrate 5. Subsequently, FIG. 2N, the further protection layer 8 is removed at points by anisotropic back-etching. In this manner, the semiconductor buffer layer 14 is exposed at points and the further protection layer 8 is used in particular for passivation of the pn-junction, i.e., the lateral surface 12c of the active region. A part of the further protection layer 8 can remain on the intermediate protection layer 4 and the photomask 81 can be used for structuring a metal layer, for example, the electrically conductive material 7, for example, by a lift-off method.

As an alternative, a method step is described in conjunction with FIG. 2O, in which the further protection layer 8 is removed from the side of the semiconductor buffer layer facing away from the growth substrate 5 by anisotropic etching. In this manner, the semiconductor buffer layer 14 is exposed and the further protection layer 8 is used in particular for passivation of the pn-junction, i.e., the lateral surface 12c of the active region. The further protection layer 8 can be completely removed in this case from the side of the intermediate protection layer 4 facing away from the growth substrate 5.

In following method steps, FIG. 2P, for example, an electrically conductive material 7 is poured into the opening 23, which electrically contacts the semiconductor material of the semiconductor buffer region 14. Furthermore, a carrier 6 is applied and the growth substrate 5 can be removed, wherein the top side of the semiconductor buffer region 14 facing away from the carrier 6 can be roughened.

Overall, in this manner an optoelectronic semiconductor chip is produced, the top side of which, facing away from the carrier 6, through which radiation to be detected or generated passes, is free of contact points. The current distribution is performed from the side of the carrier 6.

A further exemplary embodiment of a method described here is explained in greater detail in conjunction with the schematic sectional views of FIGS. 3A to 3H.

Figure 3A:
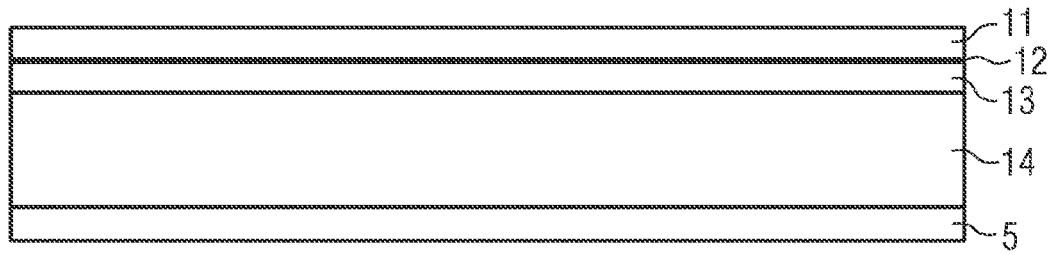
Figure 3B:
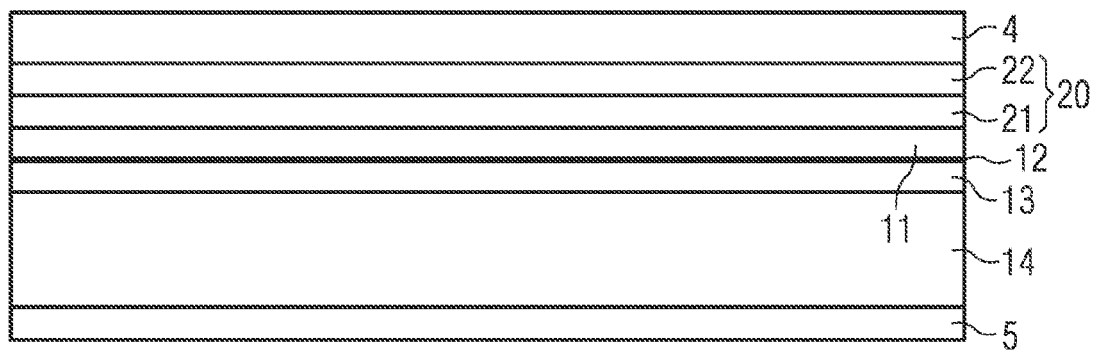
Figure 3C:
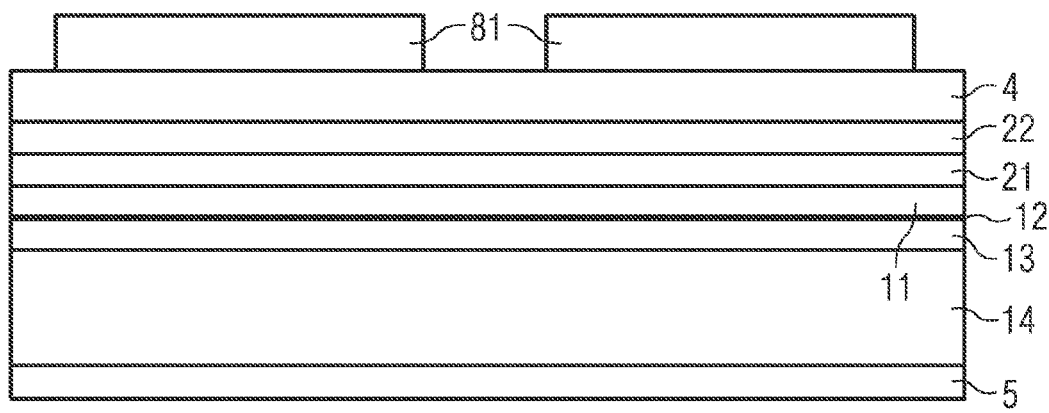

Firstly, a growth substrate 5 is provided, on which, for example, a semiconductor buffer region 14 is epitactically deposited (FIG. 3A). Subsequently, the semiconductor layer sequence 10 is epitactically supplemented with an n-conductive region 13, an active region 12, and a p-conductive region 11. For example, if the optoelectronic semiconductor chip is a radiation-generating semiconductor chip, electromagnetic radiation is thus generated in the active region 12 in the finished semiconductor chip.

In contrast to the method described in conjunction with FIGS. 2A to 2P, in the following step, a further layer 22, which contains titanium or consists of titanium, for example, and has a thickness of at most 20 nm, for example, 10 nm, is applied to the metallic semiconductor layer 21, which can have a thickness of 140 nm, for example, and which consists of silver, for example. The intermediate protection layer 4, which has, for example, a thickness of at least 300 nm, for example, 330 nm, follows on the side of the further mirror layer 23 facing away from the growth substrate 5.

In a following method step, a photomask 81 is applied to the top side of the intermediate protection layer 4. In the present case, the photomask 81 is a material which can be photo-structured, for example, a positive photoresist, FIG. 3C.

Figure 3D:
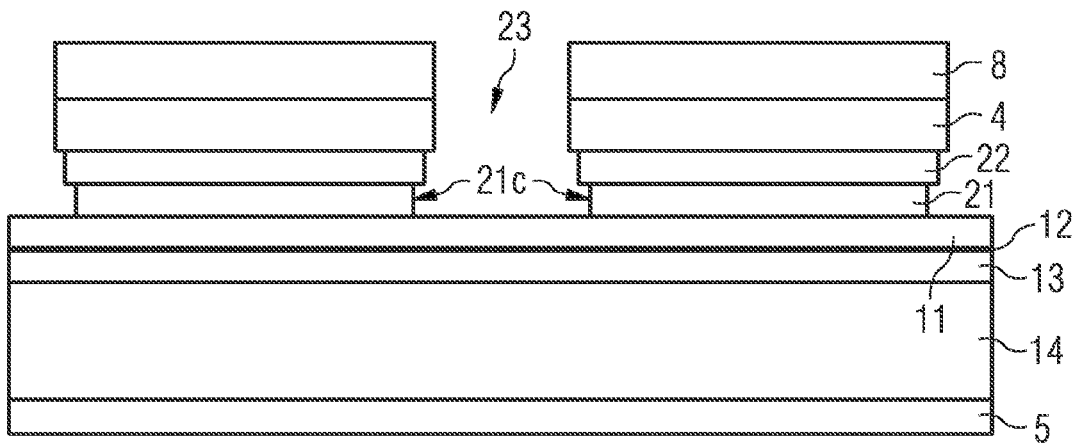
Figure 3E:
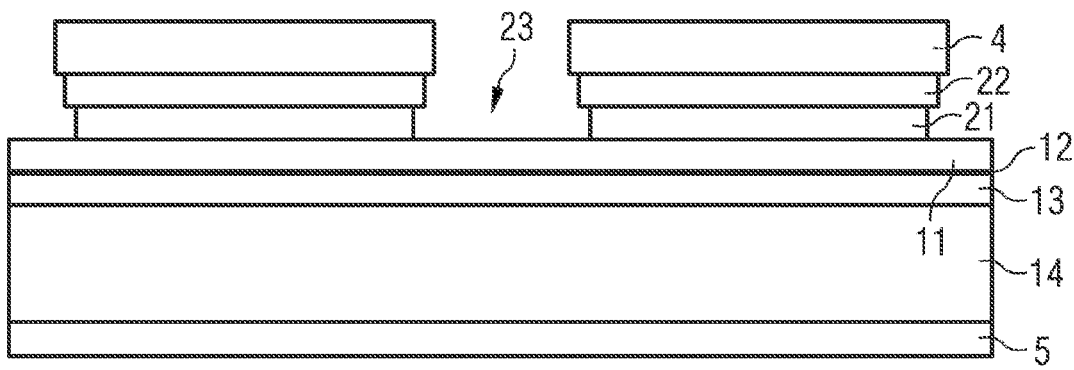

Subsequently, FIG. 3D, a wet-chemical etching step is performed, during which the mirror layer 21 is drawn in the lateral directions 1 behind the lateral surfaces of the intermediate protection layer 4 and the further mirror layer 22 such that a part of these layers protrudes in the lateral directions 1 beyond the exposed lateral surfaces 21c of the metallic mirror layer 21. Openings 23 are created in the mirror layer by the structuring of the mirror layer 21. The photomask 81 is subsequently removed, FIG. 3E.

Figure 3F:
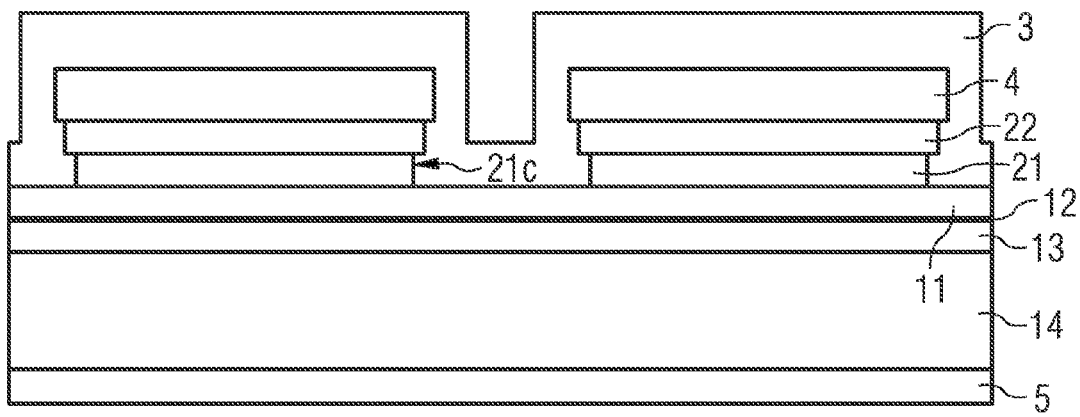

In the next method step, FIG. 3F, the mirror protection layer 3 is deposited in a conforming manner on the top side of the intermediate protection layer 4 facing away from the growth substrate 5 and on the lateral surfaces of the intermediate protection layer 4, the further mirror layer 22, and the mirror layer 21. The intermediate protection layer 4 protects the mirror layers 21, 22 from damage during this deposition operation.

In the following method step, anisotropic etching is performed, wherein the mirror protection layer 3 is completely removed on the top side of the intermediate protection layer 4 facing away from the growth substrate 5 and the semiconductor layer sequence 10 in the opening 23 is exposed from the material of the mirror protection layer 3, FIG. 3G. Dry etching into the semiconductor layer sequence 10 is subsequently performed.

As shown in FIG. 3H, very small lateral protrusions d of the active region 12 beyond the mirror layer 21 or the mirror layer sequence 20, respectively, can be achieved using the method described here. In this manner, the region of the active region which is not usable for radiation generation or radiation detection is kept very small. This is also apparent, for example, from the top views of FIGS. 5A to 5C.

In the next method step, FIG. 3I, the further protection layer 8 is again deposited in a conforming manner, such that at least the lateral surfaces of the mirror layer sequence 20 and the lateral surfaces of the active region 12 are covered by the further protection layer 8.

In particular, it is thus possible that the further protection layer 8 extends along the entire recess or opening in the semiconductor layer sequence 10 and in particular also covers a base surface of this recess or opening. The conforming deposition can again be performed by means of one of the above-mentioned methods. In particular, oxides or nitrides such as silicon dioxide, $Si_3N_4$, and/or $Al_2O_3$ can again be used as a material for the further protection layer 8. In this case, it is possible in particular that layer stacks made of this material are also used, wherein different layers of the layer stack can be formed using different materials.

Figure 3J:
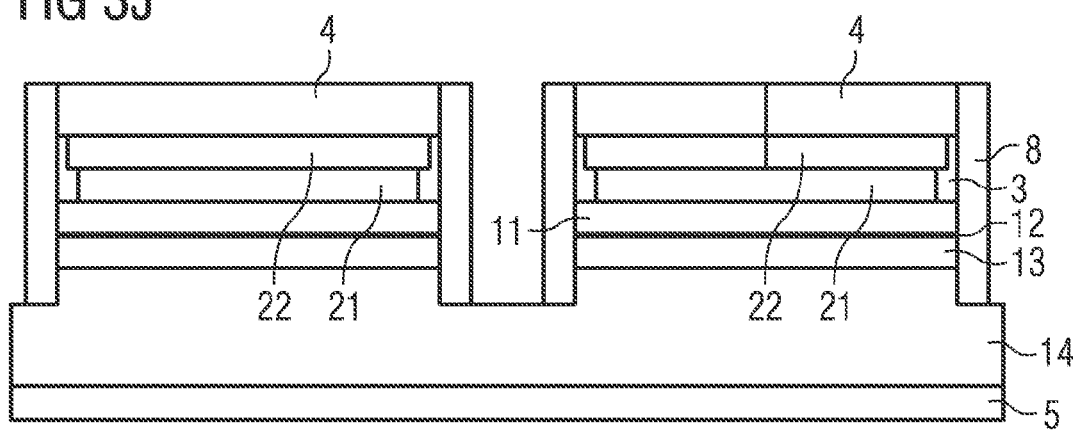
Figure 3K:
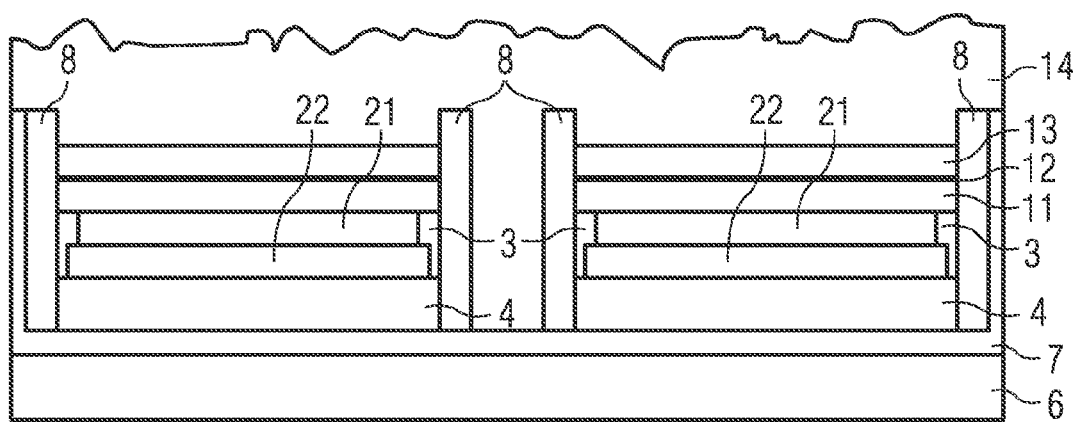

A method step is described in conjunction with FIG. 3J, in which the further protection layer 8 is removed from the side of the semiconductor buffer layer facing away from the growth substrate 5 by anisotropic etching. In this manner, the semiconductor buffer layer 14 is exposed and the further protection layer 8 is used in particular for passivation of the pn-junction, i.e., the lateral surface 12c of the active region.

In following method steps, for example, an electrically conductive material 7 is poured into the opening 23, which electrically contacts the semiconductor material of the semiconductor buffer region 14. Furthermore, a carrier 6 is applied and the growth substrate 5 can be removed, wherein the top side of the semiconductor buffer region 14 facing away from the carrier 6 can be roughened, see FIG. 3K.

A further exemplary embodiment of a method described here is explained in greater detail in conjunction with the schematic sectional views of FIGS. 4A to 4H.

Figure 4A:

FIG. 4A shows a first method step, in which a semiconductor buffer region 14 is deposited on the top side of a growth substrate 5. For example, the growth substrate is a sapphire substrate or a silicon substrate, on which a semiconductor layer sequence 10, which is based, for example, on a nitride compound semiconductor material, is deposited. For example, the semiconductor buffer region 14 is a layer which is formed using GaN.

Figure 4B:
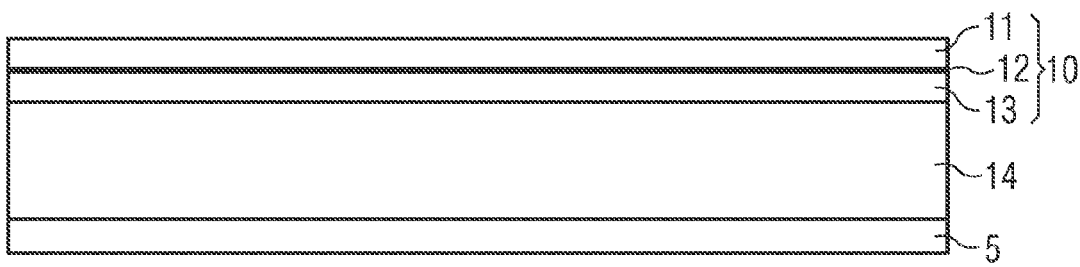

Subsequently, FIG. 4B, an n-doped region 13, an active region 12, and a p-doped region are epitactically deposited.

Figure 4C:
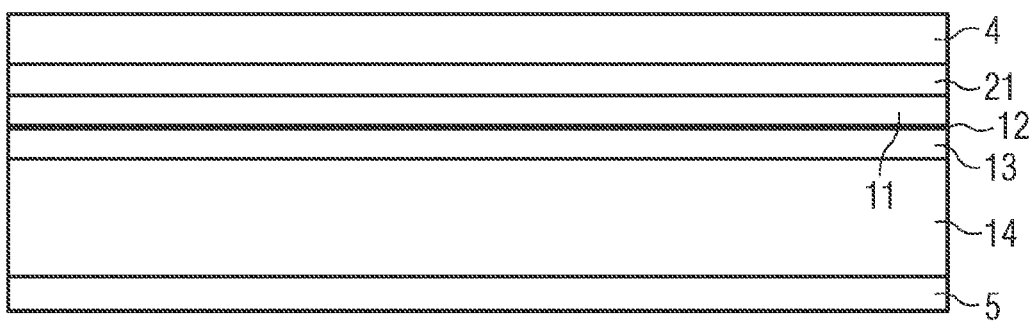
Figure 4G:
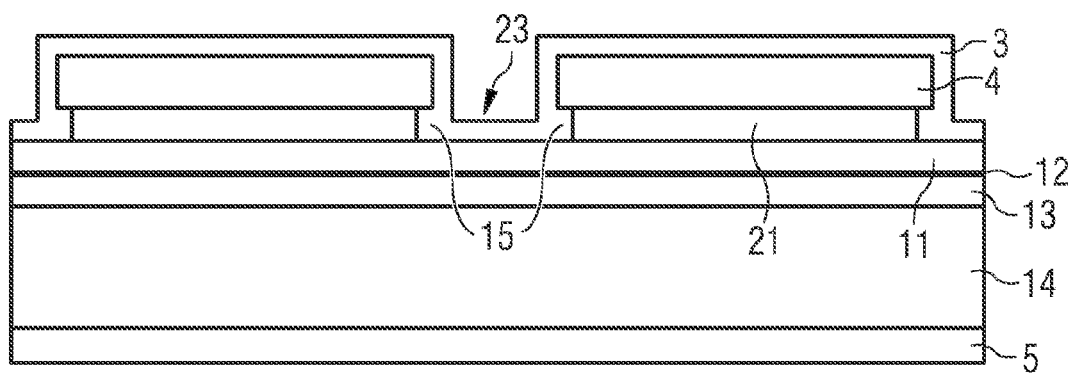

Subsequently, FIG. 4C, the arrangement of a metallic mirror layer 21 is performed on the top side of the semiconductor layer sequence 10 facing away from the growth substrate 5. For example, the metallic mirror layer 21 is a silver mirror. For example, the metallic mirror layer is vapor-deposited or sputtered on. In this case, the mirror layer 21 can also be part of a mirror layer sequence, as is described above.

After the application of the mirror layer 21 or the mirror layer sequence, the intermediate protection layer 4 is applied to the side of the mirror layer 21 facing away from the semiconductor layer sequence. The intermediate protection layer 4 is formed, for example, using a silicon dioxide formed from silane. Alternatively, the intermediate protection layer can also be vapor-deposited or sputtered.

In a following method step, FIG. 4D, a photoresist layer 81, which is formed using a positive photoresist, for example, is applied, for example, spin-deposited onto the top side of the intermediate protection layer 4 facing away from the growth substrate 5. The photoresist layer 81 is then exposed and developed to form the photomask 81, see FIG. 4E.

Subsequently, the intermediate protection layer 4 and the mirror layer 21 are structured by an etching step using the photomask 81, FIG. 4F. In this case, a chamfer 15 can form below the intermediate protection layer 4, in the region of which the mirror layer is retracted in the lateral directions in relation to the intermediate protection layer 4. The chamfer 15 can subsequently be filled with the material of the mirror protection layer 3. For this purpose, it is possible that the entire side facing away from the growth substrate 5 is covered with the mirror protection layer 3, FIG. 4G.

The mirror protection layer 3 consists in this example of a material which was deposited by an ALD process. It is advantageous here that the layer thickness of the mirror protection layer 3 is at least half of the height of the chamfer 15. The chamfer 15 is therefore completely lined by the mirror protection layer 3.

Figure 4H:
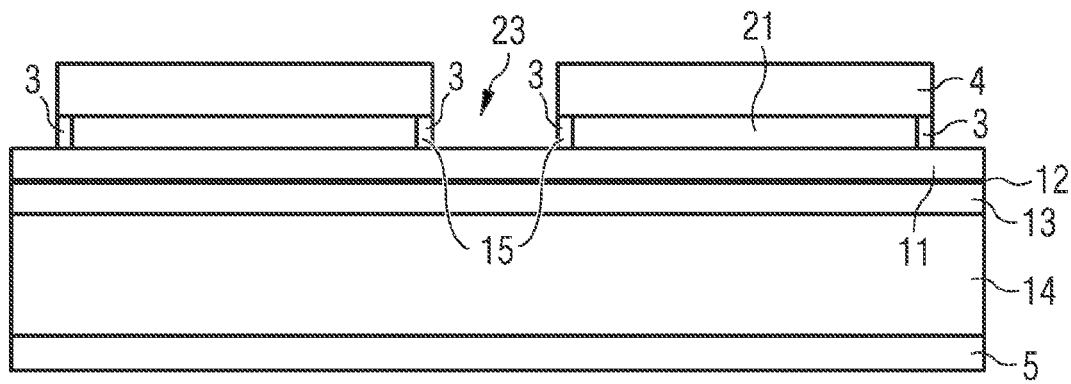

In this example, the mirror protection layer 3 is again completely removed in the area using an isotropic, wet-chemical etching process and only remains intact in the region of the chamfer 15 at least at the interface to the mirror layer, FIG. 4H. In particular a sufficient depth of the chamfer 15 in relation to the etching rate of the mirror protection layer 3 is advantageous for the process success, since a retraction of the mirror protection layer 3 behind the edge of the intermediate protection layer 4 automatically results. It is advantageous for the process if the mirror protection layer 3 can be etched as selectively as possible in relation to the intermediate protection layer 4 and/or the thicknesses of the two layers are very different. The chamfer 15 is thus filled with the mirror protection layer 3. The edge of the mirror protection layer 3 is drawn slightly behind the edge of the intermediate protection layer 4.

Further method steps follow, as are described in conjunction with FIGS. 2K to 2P.

FIG. 5A shows through-contacts through the mirror layer 21, through which the semiconductor buffer region 14 can be contacted. As a comparison with FIG. 6 shows, which shows the same situation for a conventional optoelectronic semiconductor chip, the protrusion d for the semiconductor chip 1 produced according to a method described here is extremely small. In this manner, the inactive region 100 is also kept very small. For example, the thickness d of the inactive region 100 in the exemplary embodiment of FIG. 5A is at most 1000 nm, while in contrast it can be several micrometers in the case of the semiconductor chip 1 of FIG. 6. A detail of a sectional view along line AA' is shown, for example, in conjunction with FIG. 2, 3, or 4.

In this manner, it is possible, for example, to implement the optoelectronic semiconductor chip 1 shown in FIG. 5B, which has a plurality of individually activatable active regions, which are separated from one another by very thin trenches. This means that, using the method presented here, for example, so-called LED micro-displays having pixel sizes of a few micrometers edge length can be implemented, without impermissibly wide separating trenches being present between the individual pixels, which would result in poor area usage of the active region 12 of the semiconductor chip.

Using conventional production methods, which result in semiconductor chips 1 as are shown in FIG. 6, an area usage of the contact recesses in the mirror of approximately 50% can be achieved. In this case, between approximately 10 and 30 through-contacts are created through the active region per square millimeter of chip area.

Using the method described here, a semiconductor chip 1 is possible as shown in FIG. 5C. For this semiconductor chip, the number of the through-contacts can be at least 100 through-contacts per square millimeter up to several thousand through-contacts per square millimeter. The area usage of the contact recesses can be greater than 90%, particularly homogeneous current distribution results and therefore particularly homogeneous radiation generation or radiation detection over the entire chip area. Furthermore, in this manner enclosures are reduced in a solder below the through-contacts, i.e., between carrier 6 and semiconductor layer sequence 10 in the electrically conductive material 7.

FIGS. 7A to 7I show schematic illustrations of partial regions of optoelectronic semiconductor chips. FIGS. 7A to 7I show in this case sectional views in the region of the openings 23, i.e., the through-contacts through the active zone 12.

FIG. 7A shows a sectional view through a semiconductor chip without intermediate protection layer 4. If one follows the upper edge of the mirror protection layer 3 here, i.e., the top side of the mirror protection layer 3 facing away from the mirror layer 21, in the direction of the center of the through-contact, then a transition step of the mirror protection layer 3 adjoins indirectly or directly after the mirror edge. This is followed by the region A1-A2, in which the top edge of the mirror protection layer 3 extends in parallel to the interface between mirror layer 21 and semiconductor layer sequence 10. The semiconductor transition edge adjoins thereon, where the mirror protection layer 3 covers the lateral surface of the semiconductor layer sequence 10 facing toward the opening 23, and the region B1-B2 then follows. The top edge of the mirror protection layer 3 also extends in parallel to the interface between mirror layer 21 and semiconductor layer sequence 10 in this region.

FIGS. 7B and 7C show sectional views through semiconductor chips having an intermediate protection layer 4. FIG. 7B shows a variant without implementation of a chamfer under the intermediate protection layer 4, and FIG. 7C shows a variant with implementation of a chamfer under the intermediate protection layer 4.

If one follows the top edge of the mirror protection layer 3 in the direction of the center of the through-contact, a region A1-A2, in which the top edge of the mirror protection layer 3 extends in parallel to the interface between mirror layer 21 and semiconductor layer sequence 10, does not adjoin after the mirror layer edge and the directly or indirectly following transition step. There is also no region B1-B2 after the transition steps in the semiconductor, in which the top edge of the mirror protection layer 3 would extend in parallel to the interface between mirror layer 21 and semiconductor layer sequence 10. In this case, the mirror protection layer 3 thus only covers the lateral surfaces of the mirror layer 21 and the intermediate protection layer 4. The lateral surface of the semiconductor layer sequence 10 remains free of the mirror protection layer 3. Because of the small area which the mirror protection layer 3 covers in these exemplary embodiments and because of the fact that the mirror protection layer is not implemented over step edges, for example, between the top side of the semiconductor layer sequence and the lateral surface of the semiconductor layer sequence, the mirror protection layer is implementable as particularly dense in this exemplary embodiment.

FIGS. 7D and 7E show variants of the exemplary embodiment described in conjunction with FIG. 7C, in which a blank space 31 is present in the protection layer 3 because of a non-optimized process. This blank space 31 hardly impairs the function of the protection layer 3 or does not impair it at all, however.

The chamfers shown in FIGS. 7C to 7E under the intermediate protection layer 4 have a length of less than 1 µm.

Variants are shown in conjunction with FIGS. 7F to 7I, in which the chamfer has a length of greater than 1 µm. The protection layer 3 does not protrude laterally beyond the intermediate protection layer 4 in this case.

A variant is shown in conjunction with FIG. 7F, in which the chamfer is completely lined by means of an ALD method.

A variant is shown in conjunction with FIG. 7G, in which the chamfer has a blank space 31 because of a non-optimized process.

In the variant of FIG. 7H, the blank space 31 is implemented adjoining the mirror layer 21.

FIG. 7I shows a variant in which the chamfer is only implemented on its side facing toward the mirror layer 21 and which has the blank space 31 toward the further protection layer 8.

FIG. 8A shows through-contacts through the mirror layer 21, through which the semiconductor buffer region 14 can be contacted. For the electrical connection, a metallization 71 can be applied such that the semiconductor buffer region 14 is electrically connected in the through-contacts and around the mirror layer 21. This is shown in conjunction with FIG. 8B. This means that, using the method described here, frame contacts can also be produced, which can be used, for example, for sapphire flip chips or display chips.

Alternatively, it is possible that a trench 72, which severs the metallization 71, is arranged between the region of the mirror layer 21 and the semiconductor buffer regions 14, so that an electrical contact is only produced in the region of the through-contacts. This means that the frame contact is switched to be electrically inactive by an interruption in the metallization 71.

FIGS. 9A to 9C show schematic views of partial regions of optoelectronic semiconductor chips. FIGS. 9A to 9C show sectional views in this case in the region of the openings 23, i.e., the through-contacts through the active zone 12.

FIG. 9A shows a through-contact, in which the semiconductor layers 11 to 14 and the mirror layer 21 are sputtered through solely mechanically. The protection layer 3 could be omitted in the case of such a method.

A variant is described in conjunction with FIG. 9B, in which the protection layer 3 is formed by a side wall passivation 99, which is created during the etching. Upon the use of such a side wall passivation 99, for example, CHF3 and/or BCl3 can be added during the dry-chemical etching process.

In the variant of FIG. 9C, the side wall passivation 99 was removed again before application of the further protection layer 8.

The invention is not restricted thereto by the description on the basis of the exemplary embodiments. Rather, the invention comprises every novel feature and every combination of features, which includes in particular every combination of features in the patent claims, even if this feature or this combination is not explicitly specified itself in the patent claims or exemplary embodiments.

The invention claimed is:

1. A method for producing an optoelectronic semiconductor chip, the method comprising:
arranging a metallic mirror layer on a top side of a semiconductor layer sequence;
arranging a mirror protection layer at least on exposed lateral surfaces of the metallic mirror layer in a self-aligning manner, wherein the metallic mirror layer has openings toward the semiconductor layer sequence, and wherein the openings are framed in lateral directions by the mirror protection layer;
partially removing the semiconductor layer sequence in a region of the openings of the metallic mirror layer;
before arranging the mirror protection layer on the exposed lateral surfaces of the metallic mirror layer in a self-aligning manner, arranging at least one intermediate protection layer on the top side of the metallic mirror layer facing away from the semiconductor layer sequence; and
while arranging the mirror protection layer on the exposed lateral surfaces of the metallic mirror layer, covering exposed lateral surfaces of the at least one intermediate protection layer by the mirror protection layer,
wherein the mirror protection layer is arranged to the exposed lateral surfaces of the metallic mirror layer before partially removing the semiconductor layer sequence.

2. The method according to claim 1, wherein arranging the mirror protection layer on the exposed lateral surfaces of the metallic mirror layer in a self-aligning manner comprises:
arranging the mirror protection layer on the top side of the metallic mirror layer facing away from the semiconductor layer sequence, wherein the mirror protection layer has openings toward the metallic mirror layer;
removing the metallic mirror layer in a region of the openings of the mirror protection layer to create the openings in the metallic mirror layer, wherein the mirror protection layer protrudes in the lateral directions beyond the exposed lateral surfaces of the metallic mirror layer, and wherein the lateral surfaces are exposed in the openings of the metallic mirror layer; and
softening the mirror protection layer such that at least a part of the mirror protection layer which protrudes beyond the exposed lateral surfaces of the metallic mirror layer in the lateral directions flows along the exposed lateral surfaces of the metallic mirror layer and covers the lateral surfaces.

3. The method according to claim 2, wherein arranging the mirror protection layer on the top side of the metallic mirror layer comprises forming a photo structurable material on the top side of the metallic mirror layer.

4. The method according to claim 1, wherein arranging the mirror protection layer on the exposed lateral surfaces of the metallic mirror layer in a self-aligning manner comprises conformally depositing the mirror protection layer on the top side and the exposed lateral surfaces of the metallic mirror layer, the top side facing away from the semiconductor layer sequence.

5. The method according to claim 4, wherein conformally depositing the mirror protection layer comprises depositing an oxide or a nitride, and further comprises performing at least one of the methods selected from the group consisting of plasma-assisted chemical gas phase deposition, atomic layer deposition, chemical gas phase deposition, gas phase deposition, sputtering, and vapor deposition.

6. The method according to claim 1, wherein, while structuring of the intermediate protection layer and the metallic mirror layer, implementing a chamfer underneath the intermediate protection layer thereby retracting the metallic mirror layer in the lateral directions in relation to the intermediate protection layer.

7. The method according to claim 1, wherein the metallic mirror layer comprises silver, and wherein partially removing the semiconductor layer sequence comprises etching the semiconductor layer sequence using a halide-containing material.

8. The method according to claim 1, wherein partially removing the semiconductor layer sequence comprises penetrating an active region in the semiconductor layer sequence and exposing lateral surfaces of the active region, and further comprising after exposing the lateral surfaces of the active region, arranging a further protection layer in a self-aligning manner on the exposed lateral surfaces of the active region.

9. The method according to claim 8, wherein arranging the further protection layer in a self-aligning manner comprises conformally depositing the further protection layer on the top side of the metallic mirror layer facing away from the semiconductor layer sequence and the exposed lateral surfaces of the active region.

10. The method according to claim 8, further comprising:
exposing a semiconductor buffer region on a side of the active region facing away from the metallic mirror layer; and
applying an electrically conductive material to the semiconductor buffer region thereby extending the electrically conductive material along the further protection layer.

11. The method according to claim 8, wherein the active region or the further protection layer protrudes beyond the metallic mirror layer in the lateral directions after exposing the lateral surfaces of the active region, and wherein the active region or the further protection layer protrudes beyond the metallic mirror layer by at most 2000 nm.

12. The method according to claim 1, wherein an intermediate protection layer or the mirror protection layer remain in the finished optoelectronic semiconductor chip.

13. The method according to claim 12, wherein the lateral surfaces of the semiconductor layer sequence are free of the mirror protection layer.

14. A method for producing an optoelectronic semiconductor chip, the method comprising:
arranging a metallic mirror layer on a top side of a semiconductor layer sequence;
arranging a mirror protection layer at least on exposed lateral surfaces of the metallic mirror layer in a self-aligning manner, wherein the metallic mirror layer has openings toward the semiconductor layer sequence, and wherein the openings are framed in lateral directions by the mirror protection layer; and
partially removing the semiconductor layer sequence in a region of the openings of the metallic mirror layer,
wherein arranging the mirror protection layer on the exposed lateral surfaces of the metallic mirror layer in a self-aligning manner comprises:
arranging the mirror protection layer on the top side of the metallic mirror layer facing away from the semiconductor layer sequence, wherein the mirror protection layer has openings toward the metallic mirror layer;
removing the metallic mirror layer in a region of the openings of the mirror protection layer to create the openings in the metallic mirror layer, wherein the mirror protection layer protrudes in the lateral directions beyond the exposed lateral surfaces of the metallic mirror layer, and wherein the lateral surfaces are exposed in the openings of the metallic mirror layer; and
softening the mirror protection layer such that at least a part of the mirror protection layer which protrudes beyond the exposed lateral surfaces of the metallic mirror layer in the lateral directions flows along the exposed lateral surfaces of the metallic mirror layer and covers the lateral surfaces.

15. A method for producing an optoelectronic semiconductor chip, the method comprising:
arranging a metallic mirror layer on a top side of a semiconductor layer sequence;
forming openings in the mirror layer toward the semiconductor layer sequence;
partially removing the semiconductor layer sequence in regions of the openings of the mirror layer, wherein an active region in the semiconductor layer sequence is penetrated and lateral surfaces of the active region are exposed; and
after exposing the lateral surfaces of the active region, arranging in a self-aligning manner a protection layer on the exposed lateral surfaces of the active region,
wherein forming the openings in the mirror layer is performed in a different step than partially removing the semiconductors layer sequence in the regions of the openings of the mirror layer.

* * * * *